(12) United States Patent
Lee

(10) Patent No.: US 11,956,945 B2
(45) Date of Patent: Apr. 9, 2024

(54) SEMICONDUCTOR DEVICE AND FABRICATION METHOD OF THE SAME

(71) Applicant: SK hynix Inc., Gyeonggi-do (KR)

(72) Inventor: Seung Mi Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/358,951

(22) Filed: Jul. 26, 2023

(65) Prior Publication Data

US 2023/0371238 A1 Nov. 16, 2023

Related U.S. Application Data

(63) Continuation of application No. 17/478,147, filed on Sep. 17, 2021, now Pat. No. 11,751,381.

(30) Foreign Application Priority Data

Mar. 5, 2021 (KR) .......................... 10-2021-0029507

(51) Int. Cl.
*H10B 12/00* (2023.01)

(52) U.S. Cl.
CPC ....... *H10B 12/315* (2023.02); *H10B 12/0335* (2023.02); *H10B 12/34* (2023.02); *H10B 12/482* (2023.02)

(58) Field of Classification Search
CPC .............. H10B 12/0335; H10B 12/315; H10B 12/482; H10B 12/845
See application file for complete search history.

(56) References Cited

U.S. PATENT DOCUMENTS

2015/0228574 A1* 8/2015 Kim ..................... H10B 12/482
257/773

* cited by examiner

*Primary Examiner* — Robert G Bachner
*Assistant Examiner* — Molly K Reida
(74) *Attorney, Agent, or Firm* — IP & T GROUP LLP

(57) ABSTRACT

A semiconductor device includes: a bit line structure formed over a substrate; a storage node contact plug spaced apart from the bit line structure; and a nitride spacer positioned between the bit line structure and the storage node contact plug, wherein the nitride spacer has a higher silicon content in a portion adjacent to the storage node contact plug than in a portion adjacent to the bit line structure.

10 Claims, 21 Drawing Sheets

US 11,956,945 B2

SEMICONDUCTOR DEVICE AND FABRICATION METHOD OF THE SAME

CROSS-REFERENCE TO RELATED APPLICATIONS

The present application is a continuation of U.S. patent application Ser. No. 17/478,147 filed on Sep. 17, 2021, which claims benefits of priority of Korean Patent Application No. 10-2021-0029507 filed on Mar. 5, 2021, which is incorporated herein by reference in its entirety.

BACKGROUND

1. Field

Various embodiments of the present invention relate to a semiconductor device and a fabrication method of the same, and more particularly, to a semiconductor device including a silicon nitride spacer, and a method for fabricating the semiconductor device.

2. Description of the Related Art

In a semiconductor device, a dielectric material is formed between the neighboring conductive structures, and a spacer is applied to protect the conductive structures.

However, the thickness of the spacers formed on the sidewalls of the conductive structures is decreasing as the spacers are damaged during a subsequent process.

SUMMARY

Embodiments of the present invention are directed to a semiconductor device capable of minimizing the damage of a spacer so as to provide a stable fabrication process technology, and a method for fabricating the semiconductor device.

In accordance with an embodiment of the present invention, a semiconductor device includes: a bit line structure formed over a substrate; a storage node contact plug spaced apart from the bit line structure; and a nitride spacer positioned between the bit line structure and the storage node contact plug, wherein the nitride spacer has a higher silicon content in a portion adjacent to the storage node contact plug than in a portion adjacent to the bit line structure.

In accordance with another embodiment of the present invention, a semiconductor device includes: a bit line structure formed over the substrate; a storage node contact plug spaced apart from the bit line structure; and an air gap spacer positioned between the bit line structure and the storage node contact plug, and a nitride spacer over the air gap spacer, wherein the nitride spacer has the lowest silicon content in a central portion, and has a higher silicon content in a portion adjacent to the storage node contact plug than in the central portion.

DETAILED DESCRIPTION

Figure 1:
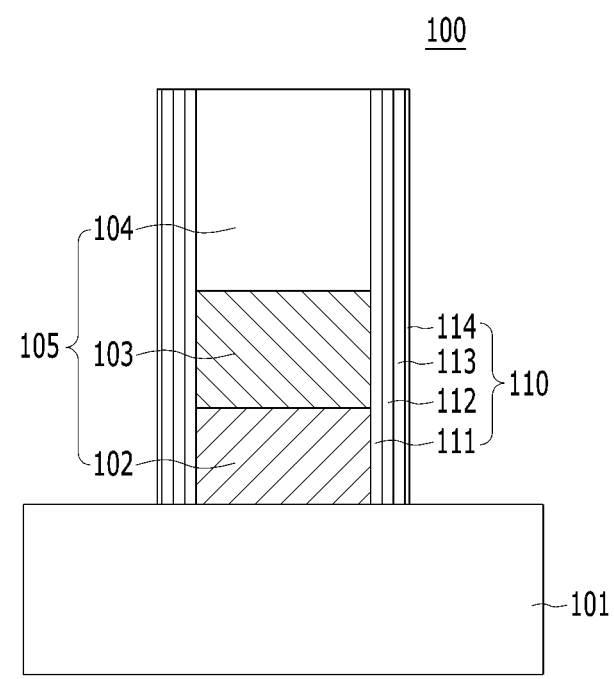
FIG. 1 is a cross-sectional view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view illustrating a semiconductor device 100 in accordance with an embodiment of the present invention.

Referring to FIG. 1, the semiconductor device 100 may include a substrate 101, a pattern structure 105, and a dielectric structure 110 formed on both sides of the pattern structure 105.

The pattern structure 105 may be formed on the substrate 101. The pattern structure 105 may include a first conductive pattern 102 formed over the substrate 101, a second conductive pattern 103 formed over the first conductive pattern 102, and a hard mask pattern 104 formed over the second conductive pattern 103. The first conductive pattern 102 may contact the substrate 101. In a variation of the illustrated embodiment, the first conductive pattern 102 and the substrate 101 may be electrically disconnected by a separating material or a dielectric material layer. The first conductive pattern 102 and the second conductive pattern 103 may include polysilicon, a metal, a metal nitride, a metal silicide, or a combination thereof. The hard mask pattern 104 may include a dielectric material.

The dielectric structure 110 may include multiple layers of dielectric materials. The dielectric structure 110 may include a stack of a first nitride spacer 113 and a second nitride spacer. The first nitride spacer 113 may be disposed over both sidewalls of the pattern structure 105. The second nitride spacer 114 may be disposed over the first nitride spacer 113. The second nitride spacer 114 may have a higher content of silicon than silicon nitride ($Si_3N_4$) having a stoichiometric composition. The first and second nitride spacers 113 and 114 may include silicon nitride. The first nitride spacer 113 may include silicon nitride having a stoichiometric composition. The second nitride spacer 114 may include silicon nitride having a higher content of silicon than the first nitride spacer 113. The second nitride spacer 114 may include a material having a lower wet etch rate than silicon nitride having a stoichiometric composition, that is, a material having more improved resistance to an etchant than silicon nitride having a stoichiometric composition, while maintaining the basic physical properties of silicon nitride having a stoichiometric composition. For example, the second nitride spacer 114 may include silicon nitride having a silicon content of approximately 45 at % to 55 at % in the film. The second nitride spacer 114 may have a thickness which is thinner than that of the first nitride spacer 113. For example, the first nitride spacer 113 may be formed to have a thickness of approximately 35 Å to 55 Å, and the second nitride spacer 114 may be formed to have a thickness of approximately 5 Å to 15 Å.

A stack of a first spacer 111 and a second spacer 112 may be positioned between the pattern structure 105 and the first nitride spacer 113. The first and second spacers 111 and 112 may be formed of different materials. The first and second spacers 111 and 112 may include one dielectric material selected among silicon nitride, silicon oxide, and silicon oxynitride. The first spacer 111 may be formed of silicon nitride. The second spacer 112 may be formed of silicon oxide. According to another embodiment of the present invention, the first spacer 111 and the second spacer 112 may be omitted.

Figure 2A:
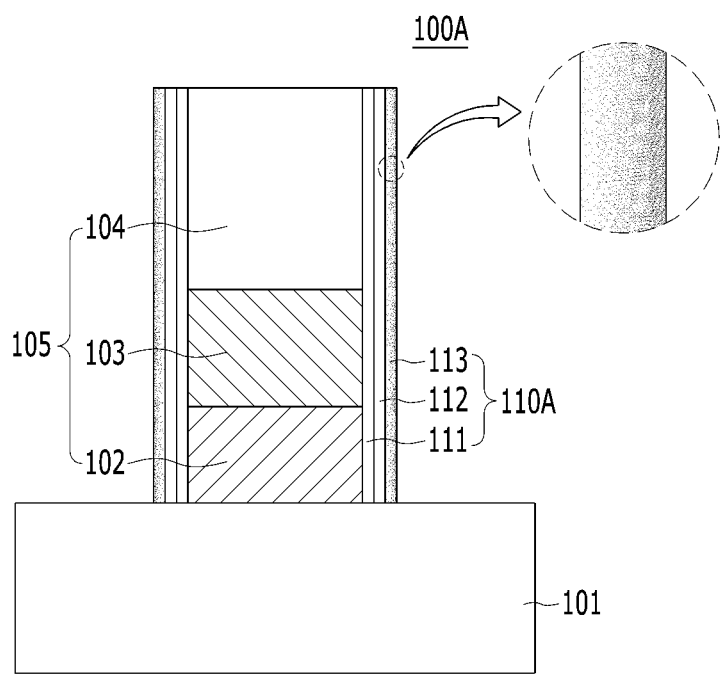
FIGS. 2A to 2C are cross-sectional views illustrating semiconductor devices in accordance with other embodiments of the present invention.
Figure 2B:
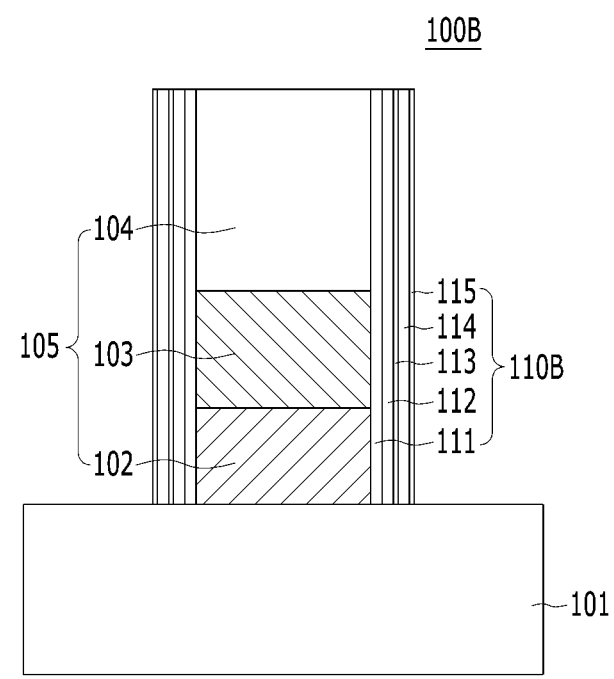
Figure 2C:
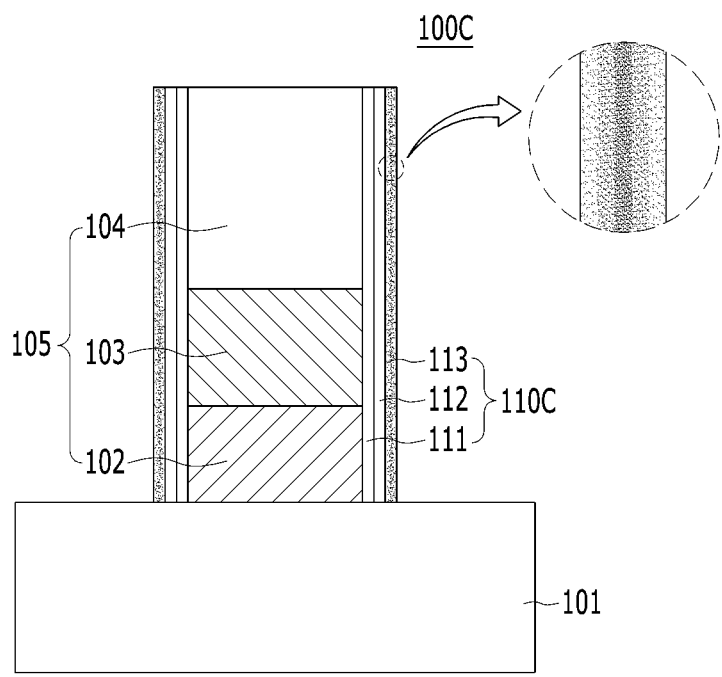

FIGS. 2A to 2C are cross-sectional views illustrating semiconductor devices in accordance with other embodiments of the present invention.

The semiconductor devices 100A, 1008, and 100C of FIGS. 2A to 2C may be similar to the semiconductor device 100 shown in FIG. 1.

The semiconductor device 100A of FIG. 2A may include a substrate 101, a pattern structure 105 over the substrate 101, and a dielectric structure 110A on both sides of the pattern structure 105.

The pattern structure 105 may further include a first conductive pattern 102 formed over the substrate 101, a second conductive pattern 103 formed over the first conductive pattern 102, and a hard mask pattern 104 formed over the second conductive pattern 103. The first conductive pattern 102 may contact the substrate 101. In a variation of the illustrated embodiment, the first conductive pattern 102 and the substrate 101 may be electrically disconnected by a separating material or a dielectric material layer. The first conductive pattern 102 and the second conductive pattern 103 may include polysilicon, a metal, a metal nitride, a metal silicide, or a combination thereof. The hard mask pattern 104 may include a dielectric material.

The dielectric structure 110 may include multiple layers of dielectric materials. The dielectric structure 110 may include a nitride spacer 113 positioned on both sidewalls of the pattern structure 105 and having a gradually increasing content of silicon from the interface with the pattern structure 105. The nitride spacer 113 may include silicon nitride. The nitride spacer 113 may be formed such that silicon nitride having a stoichiometric composition is formed at the side closer to the pattern structure 105, and the content of silicon in the film gradually increases based on the silicon nitride. The dielectric structure 110 may have the highest silicon content in a side opposite to the side closer to the pattern structure 105. The nitride spacer 113 may be formed to have a thickness of approximately 40 Å to 70 Å. For example, the nitride spacer 113 may be controlled to have a thickness of at least approximately 5 Å or more in a portion having a higher content of silicon than the silicon nitride having a stoichiometric composition.

A stack of the first spacer 111 and the second spacer 112 may be positioned between the pattern structure 105 and the nitride spacer 113. The first and second spacers 111 and 112 may be formed of different materials. The first and second spacers 111 and 112 may include one dielectric material selected among silicon nitride, silicon oxide, and silicon oxynitride. The first spacer 111 may be formed of silicon nitride. The second spacer 112 may be formed of silicon oxide.

According to another embodiment of the present invention, the first spacer 111 and the second spacers 112 may be omitted.

The semiconductor device 100B of FIG. 2B may include a substrate 101, a pattern structure 105, and a dielectric structure 110B formed on both sides of the pattern structure 105.

A pattern structure 105 may be formed over the substrate 101. The pattern structure 105 may further include a first conductive pattern 102 formed over the substrate 101, a second conductive pattern 103 formed over the first conductive pattern 102, and a hard mask pattern 104 formed over the second conductive pattern 103. The first conductive pattern 102 may contact the substrate 101. In a variation of the illustrated embodiment, the first conductive pattern 102 and the substrate 101 may be electrically disconnected by a separating material or a dielectric material layer. The first conductive pattern 102 and the second conductive pattern 103 may include polysilicon, a metal, a metal nitride, a metal silicide, or a combination thereof. The hard mask pattern 104 may include a dielectric material.

The dielectric structure 110B may include multiple layers of dielectric materials. The dielectric structure 110B may include a stack of a first nitride spacer 113, a second nitride spacer 114, and a third nitride spacer 115. The first nitride spacer 113 may be disposed over both sidewalls of the pattern structure 105. The second nitride spacer 114 may be disposed on the first nitride spacer 113. The third nitride spacer 115 may be disposed on the second nitride spacer 113. The first to third nitride spacers 113, 114, and 115 may include silicon nitride. The first and third nitride spacers 113 and 115 may include silicon nitride having a higher content of silicon than the second nitride spacer 114. The second nitride spacer 114 may include silicon nitride having a stoichiometric composition. The first and third nitride spacers 113 and 115 may include silicon nitride having a higher content of silicon than silicon nitride ($Si_3N_4$) having a stoichiometric composition. The first and third nitride spacers 113 and 115 may include a material having a lower wet etching rate than silicon nitride having a stoichiometric composition, that is, having more improved resistance to an etchant than silicon nitride having a stoichiometric composition, while maintaining the basic physical properties of silicon nitride having a stoichiometric composition. For example, the first and third nitride spacers 113 and 115 may include silicon nitride having a silicon content of approximately 45 at % to 55 at % in the film.

A stack of the first spacer 111 and the second spacer 112 may be positioned between the pattern structure 105 and the first nitride spacer 113. The first and second spacers 111 and 112 may be formed of different materials. The first and second spacers 111 and 112 may include one dielectric material selected among silicon nitride, silicon oxide, and silicon oxynitride. The first spacer 111 may be formed of silicon nitride. The second spacer 112 may be formed as an air gap. According to another embodiment of the present invention, the first spacer 111 and the second spacer 112 may be omitted.

The semiconductor device 100C of FIG. 2C may include a substrate 101, a pattern structure 105, and a dielectric structure 110C formed on both sides of the pattern structure 105.

A pattern structure 105 may be formed over the substrate 101. The pattern structure 105 may further include a first conductive pattern 102 formed over the substrate 101, a second conductive pattern 103 formed over the first conductive pattern 102, and a hard mask pattern 104 formed over the second conductive pattern 103. The first conductive pattern 102 may directly contact the substrate 101. In a variation of the illustrated embodiment, the first conductive pattern 102 and the substrate 101 may be electrically disconnected by a separating material or a dielectric material layer. The first conductive pattern 102 and the second conductive pattern 103 may include polysilicon, a metal, a metal nitride, a metal silicide, or a combination thereof. The hard mask pattern 104 may include a dielectric material.

The dielectric structure 110C may include multiple layers of dielectric materials. The dielectric structure 110C may include a nitride spacer 113 positioned on both sidewalls of the pattern structure 105 and having a silicon content varying depending on the location in the film. The nitride spacer 113 may include silicon nitride in which the content of silicon is the lowest in the central portion and the content of silicon increases as it goes toward both ends. The nitride spacer 113 may include silicon nitride in which the content of silicon in the central portion is the same as that of silicon nitride ($Si_3N_4$) having a stoichiometric composition, and the content of silicon gradually increases as it goes toward both ends. For example, the nitride spacer 113 may be formed to have a thickness of approximately 40 Å to 70 Å. For example, the nitride spacer 113 may be controlled to have a thickness of at least 5 Å or more at a portion having a higher content of silicon than silicon nitride having a stoichiometric composition.

A stack of the first spacer 111 and the second spacer 112 may be positioned between the pattern structure 105 and the nitride spacer 113. The first and second spacers 111 and 112 may be formed of different materials. The first and second spacers 111 and 112 may include one dielectric material selected among silicon nitride, silicon oxide, and silicon oxynitride. The first spacer 111 may be formed of silicon nitride. The second spacer 112 may be formed as an air gap. According to another embodiment of the present invention, the first spacer 111 and the second spacer 112 may be omitted.

Figure 3:
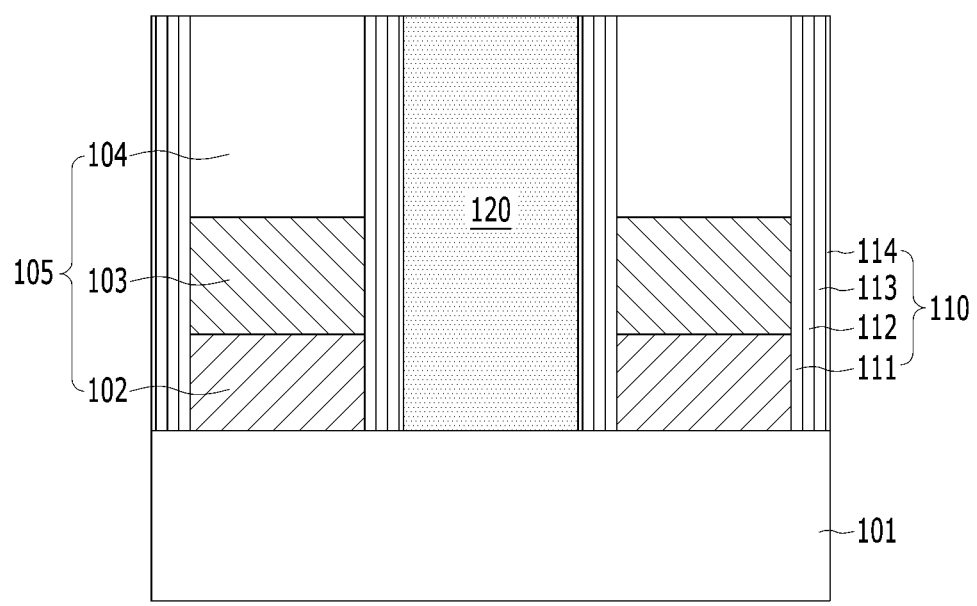
FIG. 3 is a cross-sectional view illustrating a semiconductor device in accordance with another embodiment of the present invention.

FIG. 3 is a cross-sectional view illustrating a semiconductor device 100M in accordance with another embodiment of the present invention. In FIG. 3, the same reference numerals also appearing in FIGS. 1 to 2C may denote the same constituent elements.

The semiconductor device 100M of FIG. 3 may be similar to the semiconductor devices 100, 100A, 100B, and 100C described above. The semiconductor device 100M may be similar to the semiconductor device 100 of FIG. 1. Hereinafter, detailed descriptions of the constituent elements also appearing in the embodiments already described earlier may be omitted.

Referring to FIG. 3, the semiconductor device 100M may include a substrate 101, a pattern structure 105 formed over the substrate 101, a plug structure 120 formed over the substrate 101 and between the pattern structures 105, and a dielectric structure 110 formed between the pattern structures 105 and the plug structure 120.

The pattern structure 105 may be formed over the substrate 101. The pattern structure 105 may further include a first conductive pattern 102 formed over the substrate 101, a second conductive pattern 103 formed over the first conductive pattern 102, and a hard mask pattern 104 formed over the second conductive pattern 103. The first conductive pattern 102 may directly contact the substrate 101. In a variation of the illustrated embodiment, the first conductive pattern 102 and the substrate 101 may be electrically disconnected by a separating material or a dielectric material layer. The first conductive pattern 102 and the second conductive pattern 103 may include polysilicon, a metal, a metal nitride, a metal silicide, and a combination thereof. The hard mask pattern 104 may include a dielectric material.

The dielectric structure 110 may include multiple layers of dielectric materials. The dielectric structure 110 may include a stack of a first nitride spacer 113 and a second nitride spacer 114. The first nitride spacer 113 may be disposed over both sidewalls of the pattern structure 105. The second nitride spacer 114 may be disposed on the first nitride spacer 113. The first and second nitride spacers 113 and 114 may include silicon nitride. The first nitride spacer 113 may include silicon nitride having a stoichiometric composition. The second nitride spacer 114 may include silicon nitride having a higher content of silicon than the first nitride spacer 113. The second nitride spacer 114 having a higher content of silicon than silicon nitride ($Si_3N_4$) having a stoichiometric composition. The second nitride spacer 114 may include a material having a lower wet etching rate than silicon nitride having a stoichiometric composition, that is, having more improved resistance to an etchant than silicon nitride having a stoichiometric composition, while maintaining the basic physical properties of silicon nitride having a stoichiometric composition. For example, the second nitride spacer 114 may include silicon nitride having a silicon content of approximately 45 at % to 55 at % in the film. The second nitride spacer 114 may have a thickness thinner than that of the first nitride spacer 113. For example, the first nitride spacer 113 may be formed to a thickness of approximately 35 Å to 55 Å, and the second nitride spacer 114 may be formed to have a thickness of approximately 5 Å to 15 Å.

A stack of the first spacer 111 and the second spacer 112 may be positioned between the pattern structure 105 and the first nitride spacer 113. The first and second spacers 111 and 112 may be formed of different materials. The first and second spacers 111 and 112 may include one dielectric material selected among silicon nitride, silicon oxide, and silicon oxynitride. The first spacer 111 may be formed of silicon nitride. The second spacer 112 may be formed of silicon oxide. According to another embodiment of the present invention, the first spacer 111 and the second spacer 112 may be omitted.

In FIG. 3, the semiconductor device 100M may be a portion of a memory cell.

In the pattern structures 105, the first conductive pattern 102 may include a bit line contact plug, and the second conductive pattern 103 may include a bit line. The plug structure 120 may include a storage node contact plug.

According to another embodiment of the present invention, the first conductive pattern 102 and the second conductive pattern 103 may be a gate electrode of a transistor. The plug structure 120 may be a contact plug which is coupled to source/drain regions of the transistor. The dielectric structure 110 may be a gate spacer or a contact spacer.

According to another embodiment of the present invention, the pattern structures 105 and the plug structure 120 may be line-shaped metal wiring.

The dielectric structure 110 may be maintained to have a sufficient thickness for insulation between the pattern structures 105 and the plug structure 120, thereby securing reliability.

Figure 4:
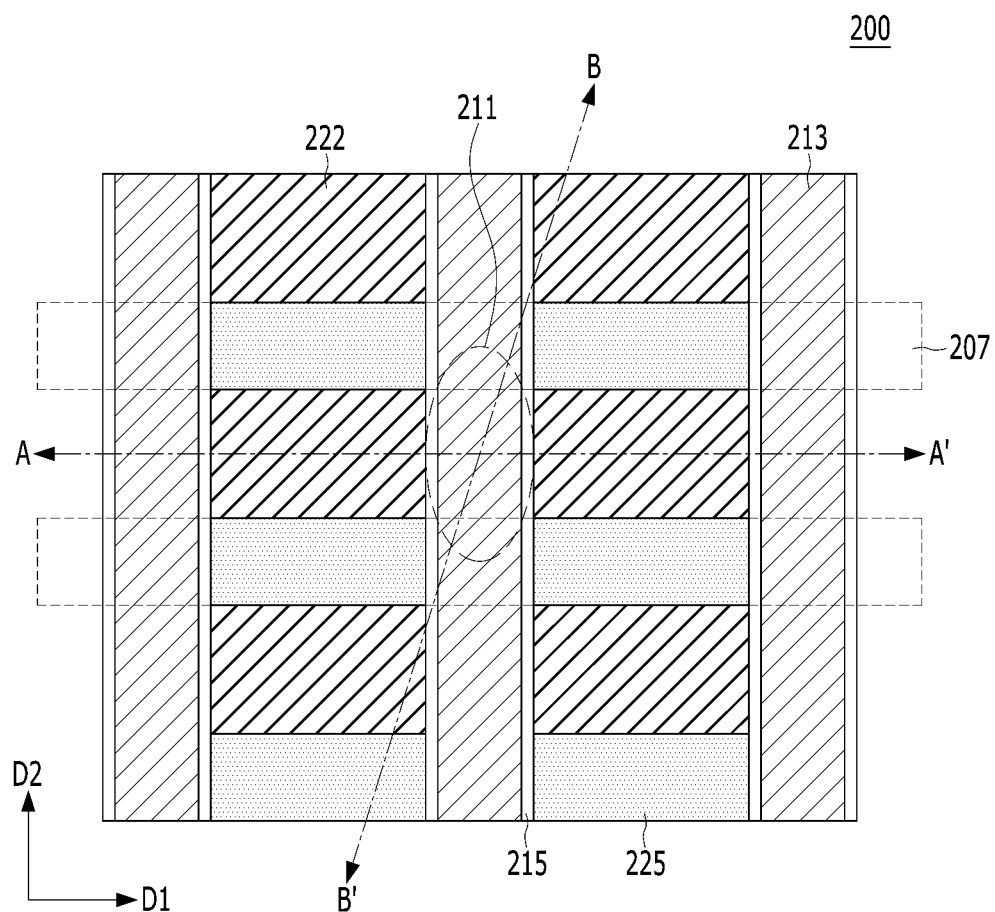
FIG. 4 is a plan view illustrating a semiconductor device in accordance with another embodiment of the present invention.
Figure 5A:
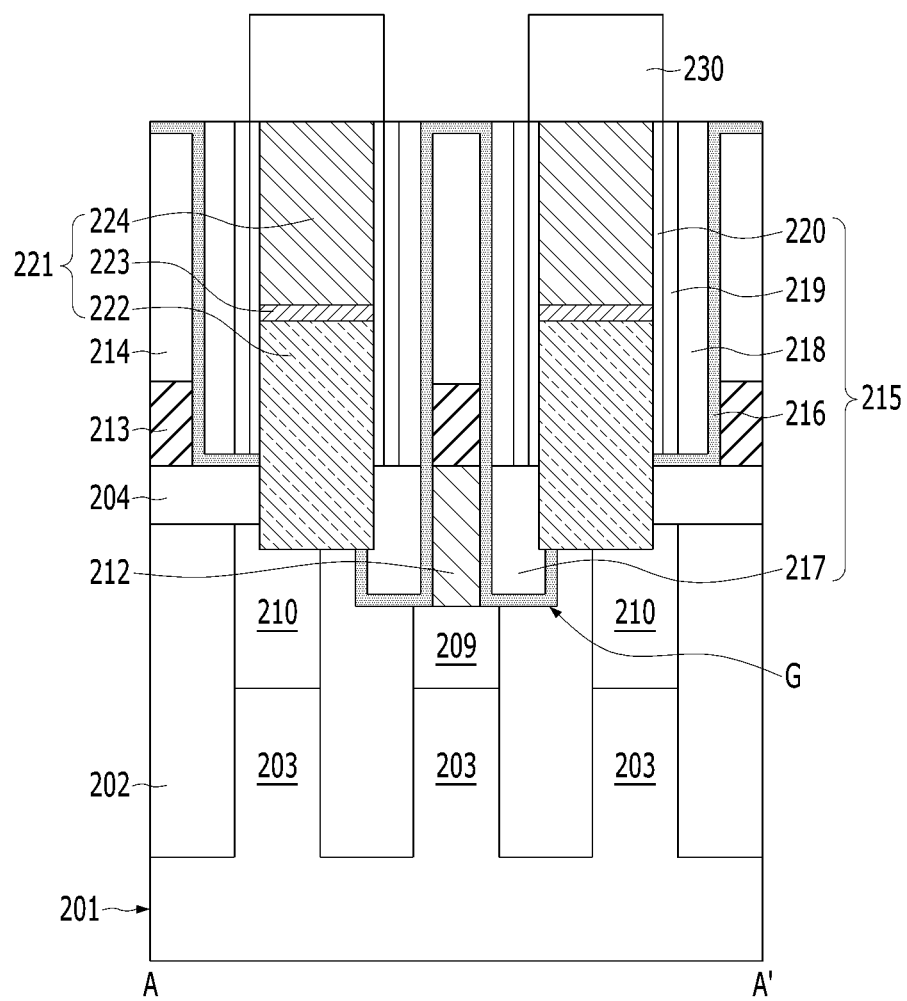
FIG. 5A is a cross-sectional view taken along a line A-A' shown in FIG. 4.
Figure 5B:
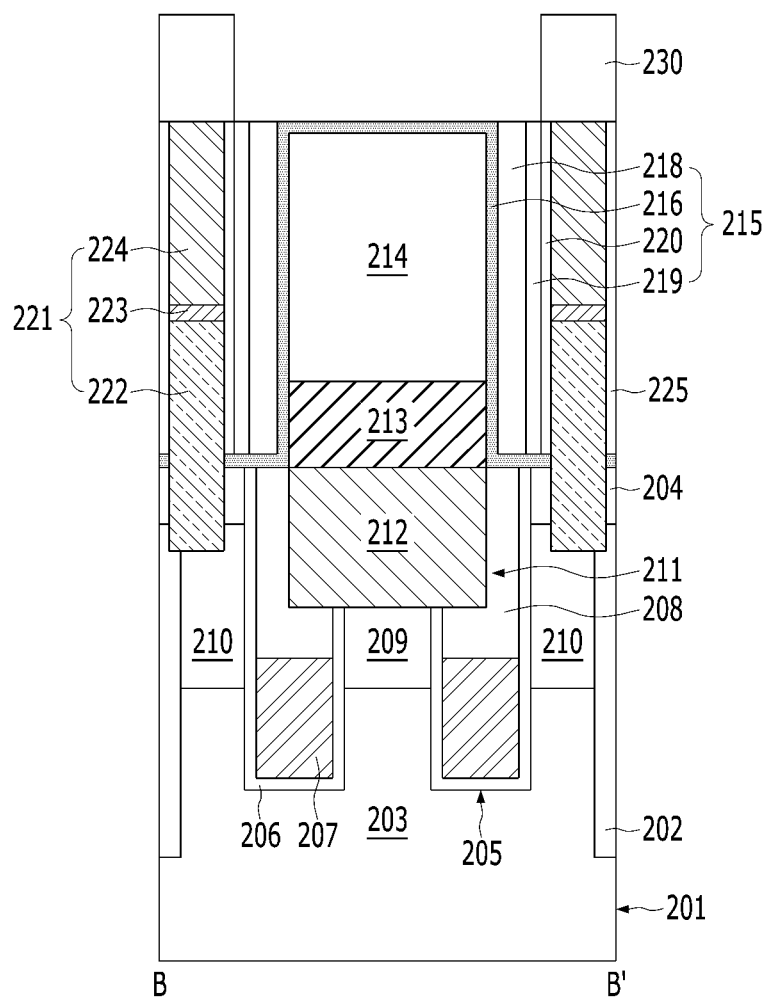
FIG. 5B is a cross-sectional view taken along a line B-B' shown in FIG. 4.

FIG. 4 is a plan view illustrating a semiconductor device 200 in accordance with another embodiment of the present invention. FIG. 5A is a cross-sectional view taken along a line A-A' shown in FIG. 4. FIG. 5B is a cross-sectional view taken along a line B-B' shown in FIG. 4.

Referring to FIGS. 4, 5A and 5B, the semiconductor device 200 may include a plurality of memory cells. Each memory cell may include a cell transistor including a buried word line 207, a bit line 213, and a memory element 230.

The semiconductor device 200 will be described in detail below.

An isolation layer 202 and an active region 203 may be formed in the substrate 201. A plurality of active regions 203 may be defined by the isolation layer 202. The substrate 201 may be a material appropriate for semiconductor processing. The substrate 201 may include a semiconductor substrate. The substrate 201 may be formed of a material containing silicon. The substrate 201 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 201 may also include another semiconductor material, such as germanium. The substrate 201 may include a III/V group semiconductor substrate, for example, a compound semiconductor substrate, such as GaAs. The substrate 201 may include a Silicon-On-Insulator (SOI) substrate. The isolation layer 202 may be formed by a Shallow Trench Isolation (STI) process.

A gate trench 205 may be formed in the substrate 201. A gate dielectric layer 206 may be formed on the surface of the gate trench 205. A buried word line 207 may be formed over the gate dielectric layer 206 to partially fill the gate trench 205. A gate capping layer 208 may be formed over the buried word line 207. a top surface of the buried word line 207 may be positioned at a lower level than a top surface of the substrate 201. The buried word line 207 may include a low-resistance metal material. In the buried word line 207, titanium nitride and tungsten may be sequentially stacked. According to another embodiment of the present invention, the buried word line 207 may be formed of titanium nitride only. The buried word line 207 may be referred to as 'a buried gate electrode'. The buried word line 207 may have a line shape extending long in a first direction D1.

A first impurity region 209 and a second impurity region 210 may be formed in the substrate 201. The first impurity region 209 and the second impurity region 210 may be spaced apart from each other by the gate trench 205. The first and second impurity regions 209 and 210 may be referred to as source/drain regions. The first and second impurity regions 209 and 210 may contain an N-type impurity such as arsenic (As) or phosphorus (P). Accordingly, the buried word line 207 and the first and second impurity regions 209 and 210 may become a cell transistor. The cell transistor may improve a short channel effect due to the buried word line 207.

A bit line contact plug 212 may be formed over the first impurity region 209 of the substrate 201. The bit line contact plug 212 may be coupled to the first impurity region 209. The bit line contact plug 212 may be located in the inside of the bit line contact hole 211. The bit line contact hole 211 may penetrate the hard mask layer 204 to extend to the substrate 201. The hard mask layer 204 may be formed over the substrate 201. The hard mask layer 204 may include a dielectric material. The bit line contact hole 211 may expose the first impurity region 209. The lower surface of the bit line contact plug 212 may be lower than the upper surfaces of the isolation layer 202 and the active region 203. The bit line contact plug 212 may be formed of polysilicon or a metal. A portion of the bit line contact plug 212 may have a line width which is smaller than the diameter of the bit line contact hole 211. A bit line 213 may be formed over the bit line contact plug 212. A bit line hard mask 214 may be formed over the bit line 213. The stacked structure of the bit line contact plug 212, the bit line 213, and the bit line hard mask 214 may be referred to also as a bit line structure. The bit line 213 may have a line shape extending in a second direction D2 crossing the buried word line 207. A portion of the bit line 213 may be coupled to the bit line contact plug 212. From the perspective of the A-A' direction, the bit line 213 and the bit line contact plug 212 may have the same line width. Accordingly, the bit line 213 may extend in the second direction D2 while covering the bit line contact plug 212. The bit line 213 may include a metal, such as tungsten. The bit line hard mask 214 may include a dielectric material, such as silicon nitride.

A spacer structure 215 may be formed on the sidewall of the bit line structure. The bit line contact hole 211 may be filled with the bit line contact plug 212 and a gap-fill spacer 217. The bit line contact hole 211 may include gaps G that are defined on both sides of the bit line contact plug 212. The inside of the gap G may be filled with a gap-fill spacer 217.

A storage node contact plug 221 may be formed between the neighboring bit line structures. The storage node contact plug 221 may be coupled to the second impurity region 210. The storage node contact plug 221 may include a lower plug 222 and an upper plug 224. The storage node contact plug 221 may further include an ohmic contact layer 223 between the lower plug 222 and the upper plug 224. The ohmic contact layer 223 may include a metal silicide. For example, the lower plug 222 may include polysilicon, and the upper plug 224 may include a metal nitride, a metal, or a combination thereof.

From the perspective of a direction parallel to the bit line structure, a plug separation layer 225 may be formed between the neighboring storage node contact plugs 221. The plug separation layer 225 may be formed between the neighboring bit line structures. The plug separation layers 225 may separate the neighboring storage node contact plugs 221. Between the neighboring bit line structures, a plurality of plug separation layers 225 and a plurality of storage node contact plugs 221 may be alternately positioned.

A memory element 230 may be formed over the upper plug 224. The memory element 230 may include a capacitor including a storage node. The storage node may have a pillar shape. In a variation of the illustrated embodiment, a dielectric layer and a plate node may be further formed over the storage node. Other than the pillar shape, the storage node may be in the shape of a cylinder or may have a hybrid shape of a combination of a cylinder and a pillar, often referred to as a pylinder. Other shapes may also be employed.

The spacer structure 215 is described as follows. The spacer structure 215 may include a first spacer 216, a gap-fill spacer 217, a second spacer 218, a first nitride spacer 219, and a second nitride spacer 220. The first spacer 216 may extend to cover the sidewall of the bit line contact plug 212 while covering the sidewall of the bit line 213. The first spacer 216 may contact the bit line 213 and the bit line contact plug 212. The gap-fill spacer 217 may be located on the sidewall of the bit line contact plug 212 and may fill the gap G. The second spacer 218 may be located on the sidewall of the bit line 213 and may not be located on the sidewall of the bit line contact plug 212.

The first nitride spacer 219 may include silicon nitride. The first nitride spacer 219 may include silicon nitride ($Si_3N_4$) having a stoichiometric composition. The second nitride spacer 220 may include silicon nitride having a higher content of silicon than the first nitride spacer 219. The second nitride spacer 220 may include a material having a lower wet etching rate than silicon nitride having a stoichiometric composition, that is, having more improved resistance to an etchant than silicon nitride having a stoichiometric composition, while maintaining the basic physical properties of silicon nitride having a stoichiometric composition. For example, the second nitride spacer 220 may include silicon nitride having a silicon content of approximately at % to 55 at % in the film. The second nitride spacer 220 may have a thickness thinner than that of the first nitride spacer 219. For example, the first nitride spacer 219 may be formed to have a thickness of approximately 35 Å to 55 Å, and the second nitride spacer 220 may be formed to have a thickness of approximately 5 Å to 15 Å.

According to another embodiment of the present invention, the first nitride spacer 219 and the second nitride spacer 220 may be replaced with a nitride spacer of a different structure, as shown in FIGS. 2A to 2C. According to another embodiment of the present invention, the second spacer 218 may be replaced with an air gap, as shown in FIGS. 2B and 2C.

The plug separation layer 225 may include silicon nitride or a low-k material. The plug separation layer 225 may include SiC, SiCO, SiCN, SiOCN, SiBN, or SiBCN.

As described above, in this embodiment of the present invention, a silicon nitride having a higher content of silicon than a silicon nitride having a stoichiometric composition may be positioned on the outermost portion, thereby improving resistance to an etchant. As a result, damage to the spacer structure 215 may be minimized during a wet etching process and/or a cleaning process. In this way, the fabrication process may be performed stably and reliability of the device may be secured.

FIGS. 6 to 18 are cross-sectional views illustrating a method for fabricating a semiconductor device in accordance with an embodiment of the present invention. FIGS. 6 to 18 are cross-sectional views illustrating a fabrication method according to the line A-A' and the line B-B' of FIG. 4.

Figure 6:
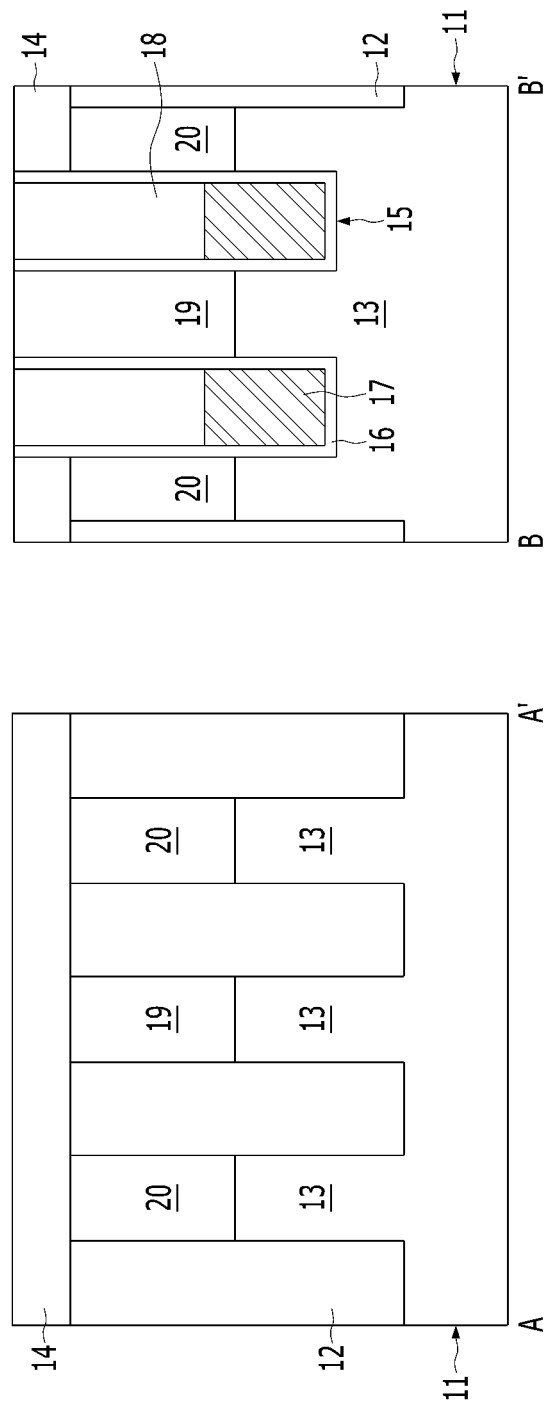
FIGS. 6 to 18 are cross-sectional views illustrating a method for fabricating a semiconductor device in accordance with an embodiment of the present invention.

As illustrated in FIG. 6, an isolation layer 12 may be formed in the substrate 11. A plurality of active regions 13 may be defined by the isolation layer 12. The isolation layer 12 may be formed by a shallow trench isolation (STI) process. The STI process may include etching the substrate 11 to form an isolation trench. The isolation trench may be filled with a dielectric material, thereby forming an isolation layer 12. The isolation layer 12 may include silicon oxide, silicon nitride, or a combination thereof. Chemical Vapor Deposition (CVD) or other deposition processes may be performed to fill the isolation trench with a dielectric material. A planarization process such as Chemical Mechanical Polishing (CMP) may additionally be used.

Subsequently, a buried word line structure may be formed in the substrate 11. The buried word line structure may include a gate trench 15, a gate dielectric layer 16 covering the bottom and sidewalls of the gate trench 15, a buried word line 17 partially filling the gate trench 15 over the gate dielectric layer 16, and a gate capping layer 18 formed over the buried word line 17.

A method for forming the buried word line structure may be described as follows.

First, the gate trench 15 may be formed in the substrate 11. The gate trench 15 may have a line shape crossing the active regions 13 and the isolation layer 12. The gate trench 15 may be formed by forming a mask pattern (not shown) over the substrate 11 and performing an etching process using the mask pattern as an etching mask. To form the gate trench 15, the hard mask layer 14 may be used as an etch barrier. The hard mask layer 14 may have a form that is patterned by a mask pattern. The hard mask layer 14 may include silicon oxide. The hard mask layer 14 may include Tetra Ethyl Ortho Silicate (TEOS). The bottom surface of the gate trench 15 may be positioned at a higher level than the bottom surface of the isolation layer 12.

In a variation of the illustrated embodiment, the active region 13 below the gate trench 15 may protrude by recessing a portion of the isolation layer 12. For example, the isolation layer 12 below the gate trench 15 may be selectively recessed in the direction of the line B-B' of FIG. 4. As a result, a fin region (a reference numeral is omitted) below the gate trench 15 may be formed. The fin region may be a portion of the channel region.

Subsequently, a gate dielectric layer 16 may be formed on the bottom surface and sidewalls of the gate trench 15. Before the gate dielectric layer 16 is formed, etching damage on the surface of the gate trench 15 may be cured. For example, after a sacrificial oxide is formed by thermal oxidation, the sacrificial oxide may be removed.

The gate dielectric layer 16 may be formed by thermal oxidation. For example, the gate dielectric layer 16 may be formed by oxidizing the bottom and sidewalls of the gate trench 15.

According to another embodiment of the present invention, the gate dielectric layer 16 may be formed by a vapor deposition method, such as Chemical Vapor Deposition (CVD) or Atomic Layer Deposition (ALD). The gate dielectric layer 16 may include a high-k material, an oxide, a nitride, an oxynitride, or a combination thereof. The high-k material may include hafnium oxide. A hafnium-containing material may include hafnium oxide, hafnium silicon oxide, hafnium silicon oxynitride, or a combination thereof. According to another embodiment of the present invention, the high-k material may include lanthanum oxide, lanthanum aluminum oxide, zirconium oxide, zirconium silicon oxide, zirconium silicon oxynitride, aluminum oxide, and a combination thereof.

According to another embodiment of the present invention, the gate dielectric layer 16 may be formed by depositing liner polysilicon and radically oxidizing the liner polysilicon layer. Any suitable deposition method may be used.

According to yet another embodiment of the present invention, the gate dielectric layer 16 may be formed by forming a liner silicon nitride layer and then radically oxidizing the liner silicon nitride layer.

Subsequently, a buried word line 17 may be formed over the gate dielectric layer 16. The buried word line 17 may be formed by forming a conductive layer (not shown) to fill the gate trench 15 and then performing a recess process. The recess process may include an etch-back process, or a Chemical Mechanical Polishing (CMP) process and an etch-back process may be sequentially performed. The buried word line 17 may have a recessed shape that partially fills the gate trench 15. In other words, the upper surface of the buried word line 17 may be positioned at a lower level than the upper surface of the active region 13. The buried word line 17 may include a metal, a metal nitride, or a combination thereof. For example, the buried word line 17 may be formed of titanium nitride (TIN), tungsten (W), or a stack of titanium nitride/tungsten (TiN/W). The titanium nitride/tungsten (TiN/W) stack may have a structure in which titanium nitride is conformally formed and then the gate trench 15 is partially filled with tungsten. As the buried word line 17, titanium nitride may be used alone, and this may be referred to as a buried word line 17 having a "TiN Only" structure. The buried word line 17 may have a double gate structure including a titanium nitride/tungsten (TiN/W) stack and a polysilicon layer.

Subsequently, a gate capping layer 18 may be formed over the buried word line 17. The gate capping layer 18 may include a dielectric material. The rest of the gate trench 15 may be filled with the gate capping layer 18 over the buried word line 17. The gate capping layer 18 may include silicon nitride. According to another embodiment of the present invention, the gate capping layer 18 may include silicon oxide. According to yet another embodiment of the present invention, the gate capping layer 18 may have a NON (Nitride-Oxide-Nitride) stacked structure. The upper surface of the gate capping layer 18 may be positioned at the same level as the upper surface of the hard mask layer 14. To this end, a CMP process may be performed when the gate capping layer 18 is formed.

After the gate capping layer 18 is formed, impurity regions 19 and 20 may be formed. The impurity regions 19 and 20 may be formed by a doping process, such as implantation. The impurity regions 19 and 20 may include a first impurity region 19 and a second impurity region 20. The first and second impurity regions 19 and 20 may be doped with impurities of the same conductivity type. The first and second impurity regions 19 and 20 may have the same depth. According to another embodiment of the present invention, the first impurity region 19 may be deeper than the second impurity region 20. The first and second impurity regions 19 and 20 may be referred to as source/drain regions. The first impurity region 19 may be a region to which a bit line contact plug is to be coupled. The first impurity region 19 and the second impurity region 20 may be positioned in different active regions 13. Also, the first impurity region 19 and the second impurity region 20 may be spaced apart from each other by the gate trenches 15 and positioned in their respective active regions 13.

A cell transistor of a memory cell may be formed by the buried word line 17 and the first and second impurity regions 19 and 20.

Figure 7:
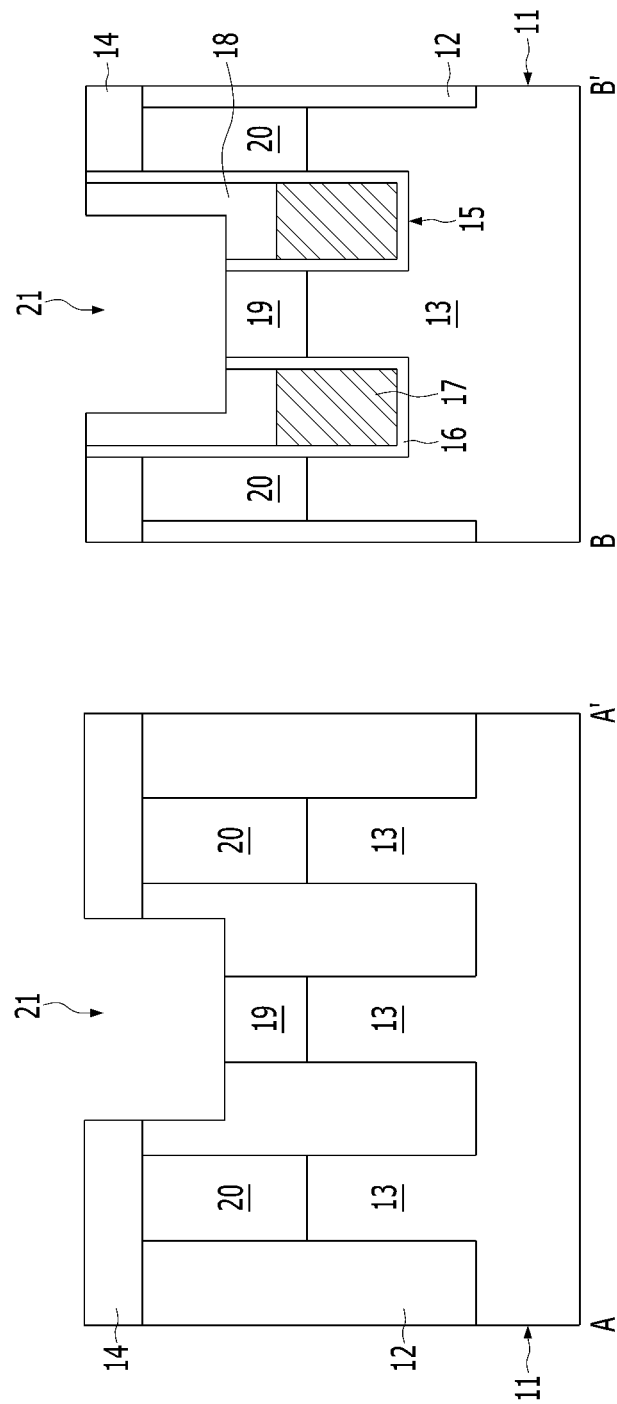

Referring to FIG. 7, a bit line contact hole 21 may be formed. The hard mask layer 14 may be etched using a contact mask (not shown) to form the bit line contact hole 21. The bit line contact hole 21 may have a circular shape or an elliptical shape from the perspective of a plan view. A portion of the substrate 11 may be exposed by the bit line contact hole 21. The bit line contact hole 21 may have a diameter which is controlled to a predetermined line width. The bit line contact hole 21 may have a shape that exposes a portion of the active region 13. For example, the first impurity region 19 may be exposed through the bit line contact hole 21. The bit line contact hole 21 may have a diameter which is larger than the width of the minor axis of the active region 21. Accordingly, in an etching process for forming the bit line contact hole 21, the first impurity region 19, the isolation layer 12, and a portion of the gate capping layer 18 may be etched. In other words, the gate capping layer 18, the first impurity region 19, and the thin isolation layer 12 below the bit line contact hole 21 may be recessed to a predetermined depth. Accordingly, the bottom of the bit line contact hole 21 may be expanded into the substrate 11. As the bit line contact hole 21 is expanded, the surface of the first impurity region 19 may be recessed, and the surface of the first impurity region 19 may be positioned at a lower level than the surface of the active region 13.

Figure 8:
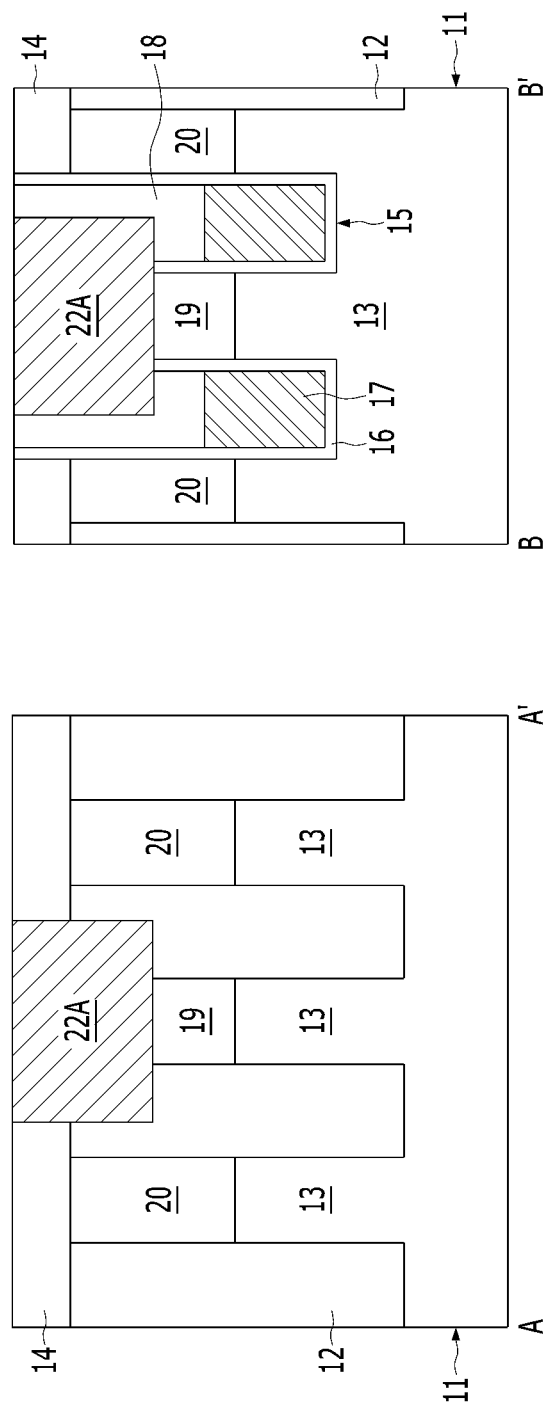

Referring to FIG. 8, a preliminary plug 22A, which is shortly referred to as pre-plug 22A, hereinafter, may be formed. The pre-plug 22A may be formed by Selective Epitaxial Growth (SEG). For example, the pre-plug 22A may include an epitaxial layer doped with phosphorus, for example, SEG SiP. In this way, the pre-plug 22A may be formed without voids by selective epitaxial growth. According to another embodiment of the present invention, the pre-plug 22A may be formed by depositing a polysilicon layer and performing a CMP process. The pre-plug 22A may fill the bit line contact hole 21. The upper surface of the pre-plug 22A may be positioned at the same level as the upper surface of the hard mask layer 14.

Figure 9:
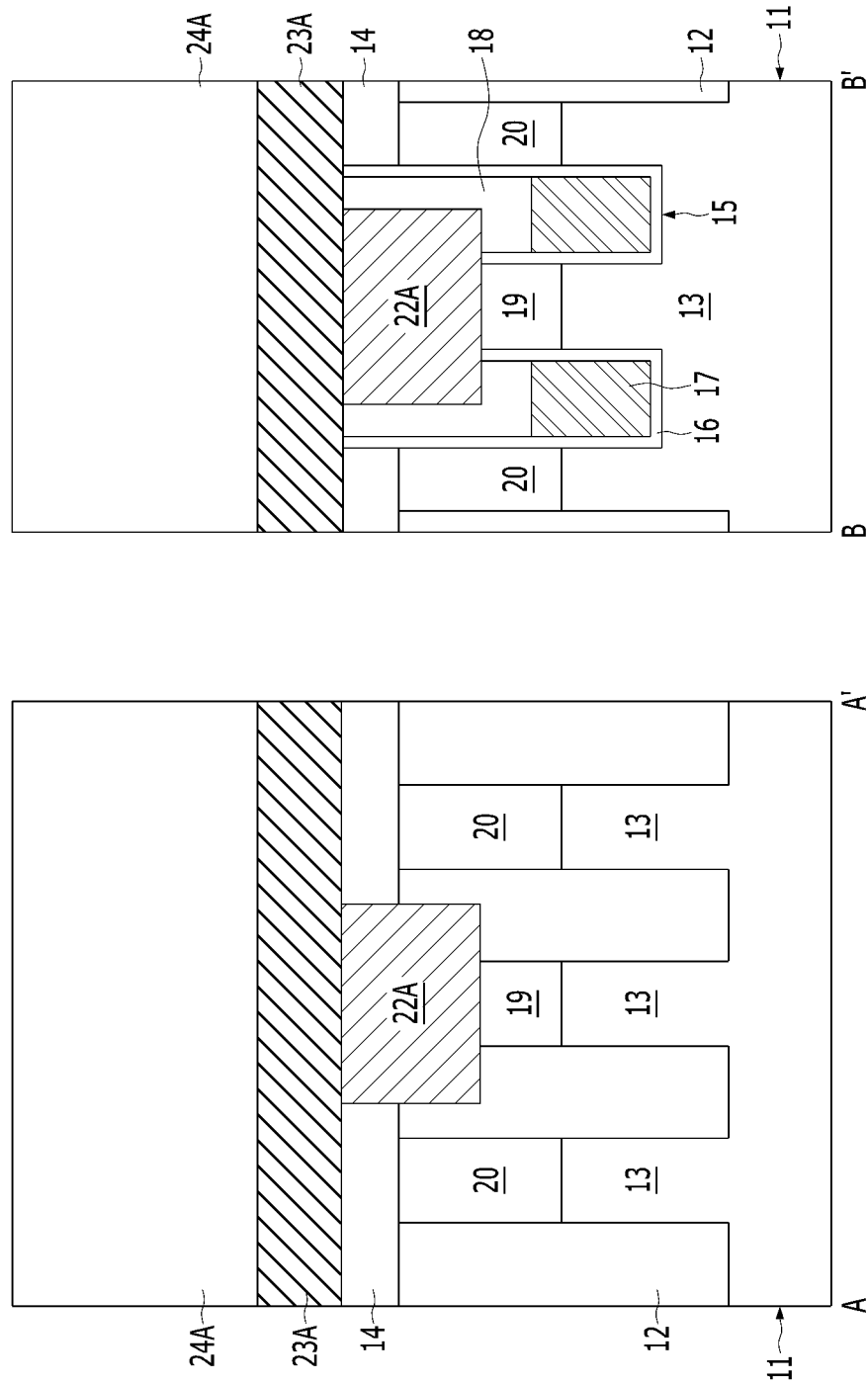

Referring to FIG. 9, a bit line conductive layer 23A and a bit line hard mask layer 24A may be stacked in the recited order. The bit line conductive layer 23A and the bit line hard mask layer 24A may be sequentially stacked over the pre-plug 22A and the hard mask layer 14. The bit line conductive layer 23A may include a metal-containing material. The bit line conductive layer 23A may include a metal, a metal nitride, a metal silicide, or a combination thereof. According to the embodiment of the present invention, the bit line conductive layer 23A may include tungsten (W). According to another embodiment of the present invention, the bit line conductive layer 23A may include a stack of titanium nitride and tungsten (TiN/W). Herein, the titanium nitride may serve as a barrier. The bit line hard mask layer 24A may be formed of a dielectric material having an etch selectivity with respect to the bit line conductive layer 23A and the pre-plug 22A. The bit line hard mask layer 24A may include silicon oxide or silicon nitride. According to the embodiment of the present invention, the bit line hard mask layer 24A may be formed of silicon nitride.

Figure 10:
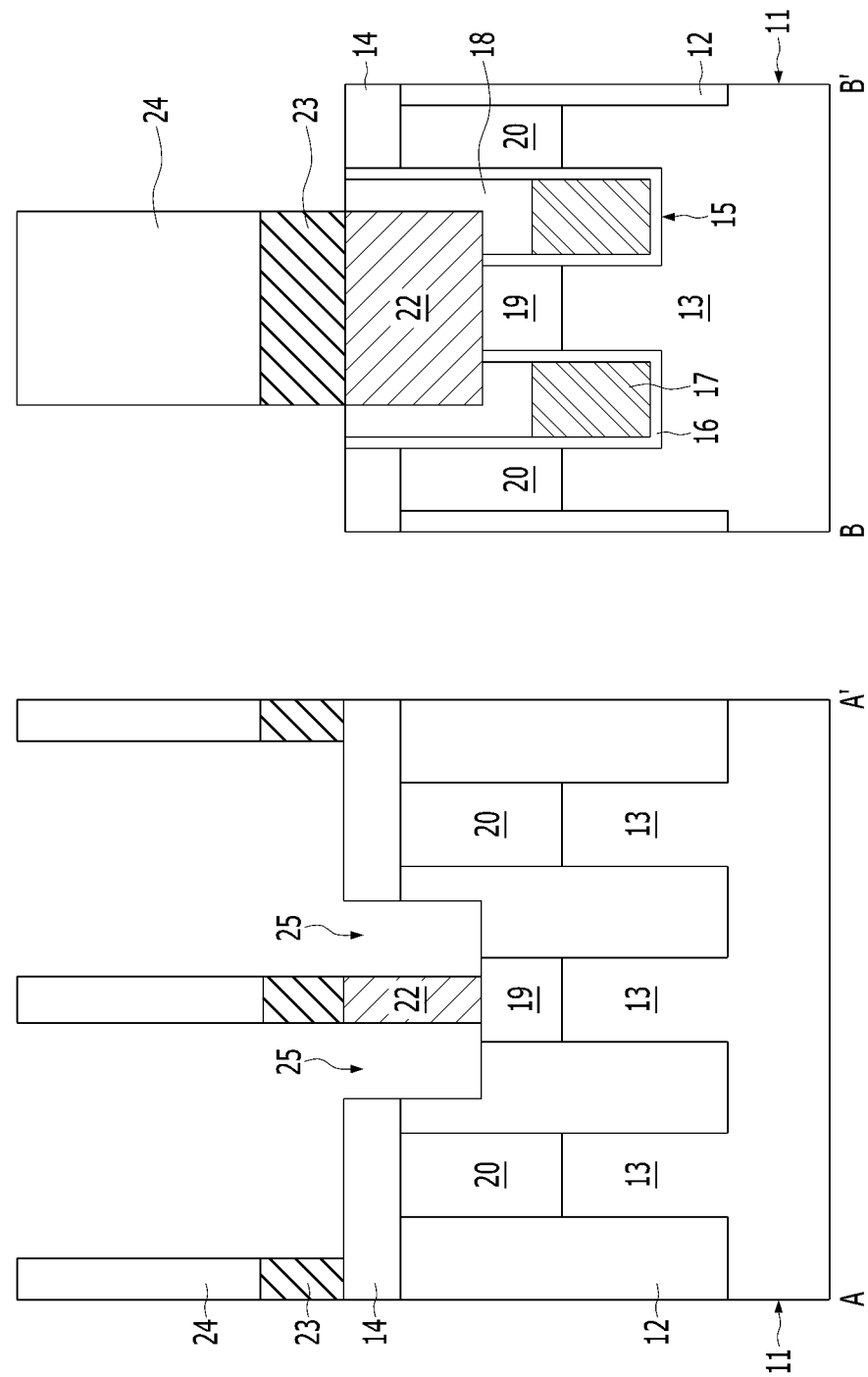

Referring to FIG. 10, a bit line 23 and a bit line contact plug 22 may be formed. The bit line 23 and the bit line contact plug 22 may be formed by an etching process using a bit line mask layer (not shown).

The bit line hard mask layer 24A and the bit line conductive layer 23A may be etched by using the bit line mask layer as an etch barrier. As a result, the bit line 23 and the bit line hard mask 24 may be formed. The bit line 23 may be formed by etching the bit line conductive layer 23A. The bit line hard mask 24 may be formed by etching the bit line hard mask layer 24A.

Subsequently, the pre-plug 22A (see FIG. 9) may be etched with the same line width as the bit line 23. Accordingly, the bit line contact plug 22 may be formed. The bit line contact plug 22 may be formed over the first impurity region 19. The bit line contact plug 22 may couple the first impurity region 19 and the bit line 23 to each other. The bit line contact plug 22 may be formed in the bit line contact hole 21. The line width of the bit line contact plug 22 may be smaller than the diameter of the bit line contact hole 21. Accordingly, gaps 25 may be defined on both sides of the bit line contact hole 21.

As described above, since the bit line contact plug 22 is formed, the gaps 25 may be formed in the inside of the bit line contact hole 21. This is because the bit line contact plug 22 is formed by being etched to be smaller than the diameter of the bit line contact hole 21. The gaps 25 may not have a shape surrounding the bit line contact plug 22 but may be formed independently on both sidewalls of the bit line contact hole 22. As a result, one bit line contact plug 22 and a pair of gaps 25 may be positioned in the inside of the bit line contact hole 21, and the pair of gaps G may be spaced apart by the bit line contact plug 22. In an embodiment, the bottom surface of the gap 25 may extend into the isolation layer 12. The lower surface of the gap 25 may be positioned at a lower level than the recessed upper surface of the first impurity region 19.

A structure in which the bit line contact plug 22, the bit line 23, and the bit line hard mask 24 are stacked in the mentioned order may be referred to as a bit line structure. From the perspective of a top view, the bit line structure may be a line-shaped pattern structure extending in one direction.

Figure 11:
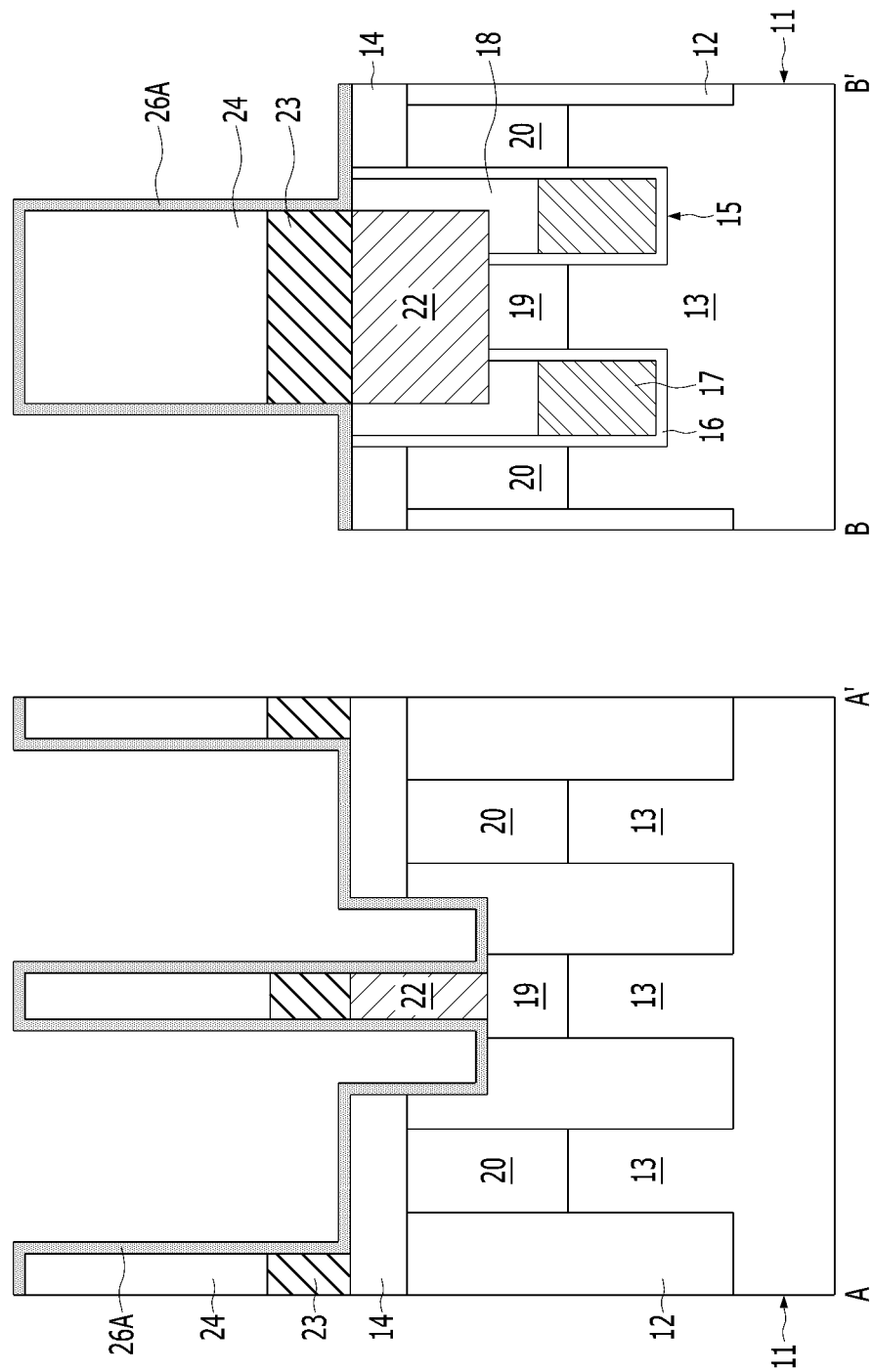

Referring to FIG. 11, a first spacer layer 26A may be formed. The first spacer layer 26A may cover the bit line structure. The first spacer layer 26A may cover both sidewalls of the bit line contact plug 22 and both sidewalls of the bit line 23. The first spacer layer 26A may cover both sidewalls and upper surface of the bit line hard mask 24. The first spacer layer 26A may include a passivation material capable of suppressing oxidation of the bit line 23. The first spacer layer 26A may include a dielectric material. According to an embodiment of the present invention, the first spacer layer 26A may include silicon nitride.

Figure 12:
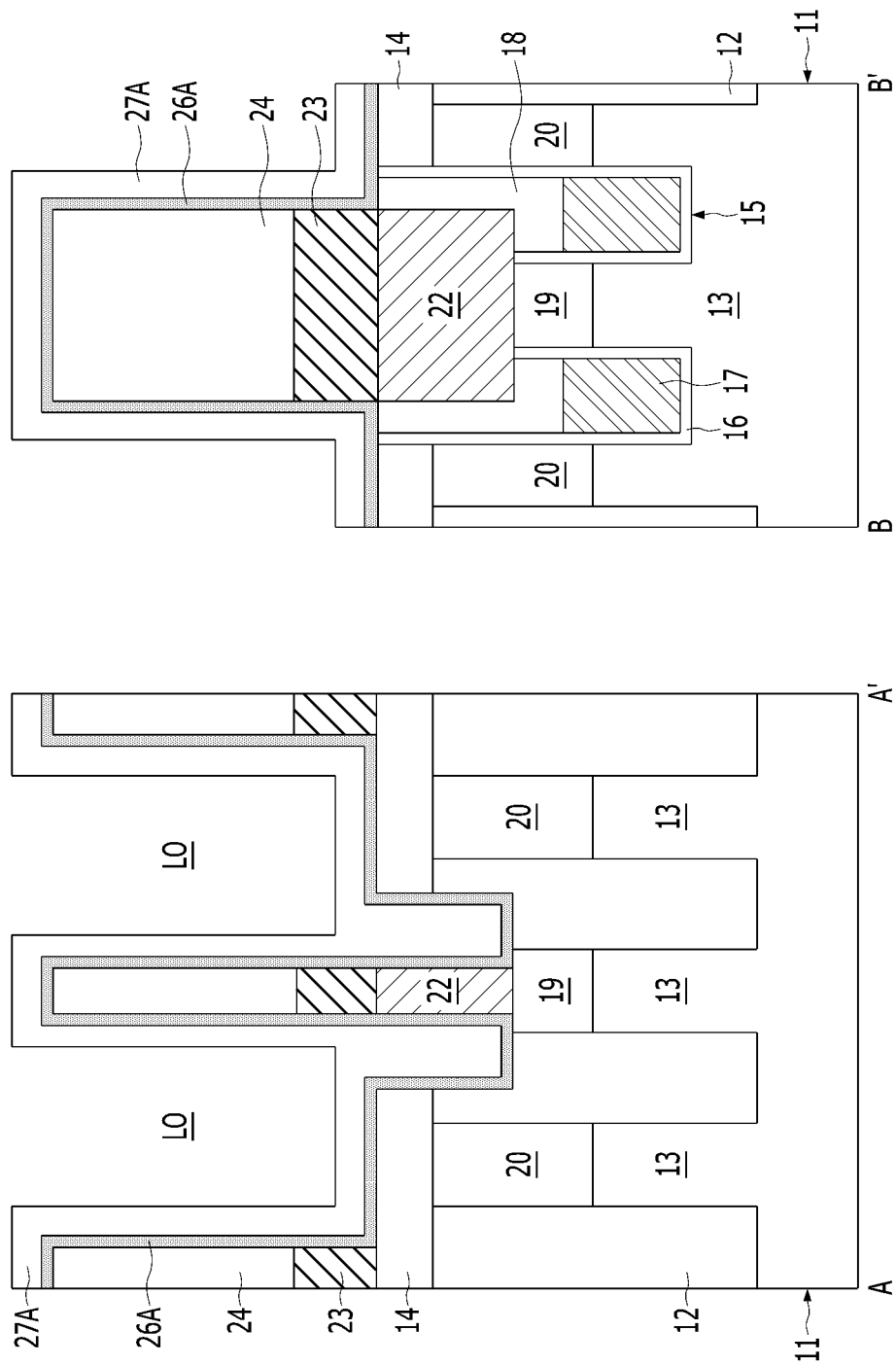
Figure 13:
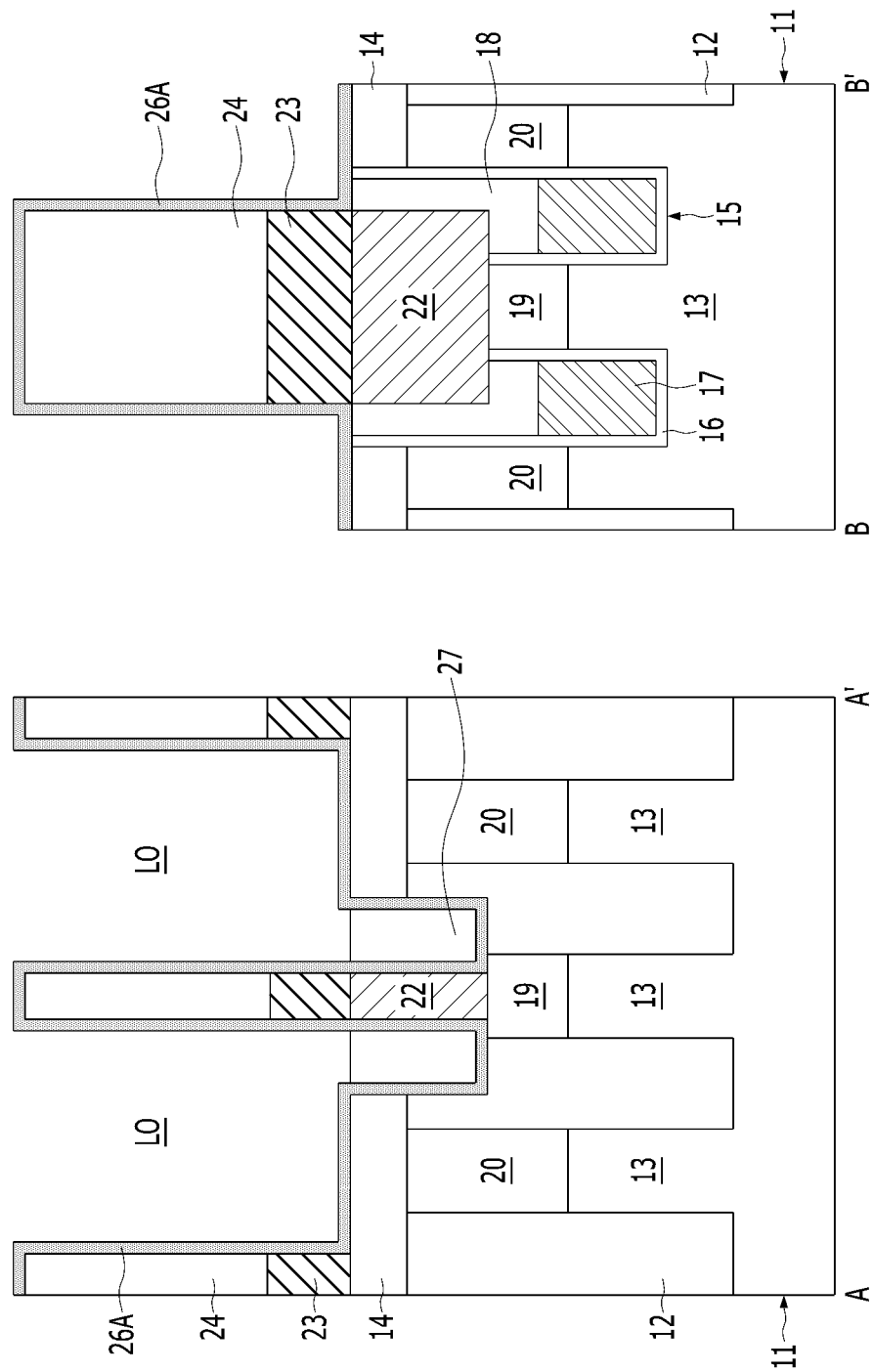

Referring to FIGS. 12 and 13, a gap-fill spacer 27 may be formed. The gap-fill spacer 27 may be formed over the first spacer layer 26A. The gap-fill spacer 27 may be formed of the same material as that of the first spacer layer 26A. According to the embodiment of the present invention, the gap-fill spacer 27 may include silicon nitride. The gap-fill spacer 27 may be thicker than the first spacer layer 26A. Before the gap-fill spacer 27 is formed, a buffer layer (not shown) may be formed over the first spacer layer 26A. The buffer layer may include a material having a lower dielectric constant than the first spacer layer 26A and the gap-fill spacer 27.

The gap-fill spacer 27 may be recessed to fill the gap 25. For example, in order to form the gap-fill spacer 27, a gap-fill material 27A may be deposited over the bit line structure and the first spacer layer 26A to fill the gap 25, and then the gap-fill material 27A may be recessed through an etch-back process. The upper surface of the gap-fill spacer 27 may be positioned at a lower level than the upper surface of the bit line contact plug 22. According to another embodiment of the present invention, the upper surface of the gap-fill spacer 27 and the upper surface of the bit line contact plug 22 may be positioned at the same level. The gap-fill material 27A may include silicon nitride.

The gap 25 may be filled with the first spacer layer 26A and the gap-fill spacer 27. The gap-fill spacer 27 may be referred to as a dielectric plug or a plugging spacer. According to another embodiment of the present invention, the gap-fill spacer 27 may be formed of silicon oxide or a low-k material.

After the gap-fill spacer 27 is formed, a line-shaped opening LO may be defined between the neighboring bit lines 23.

Figure 14:
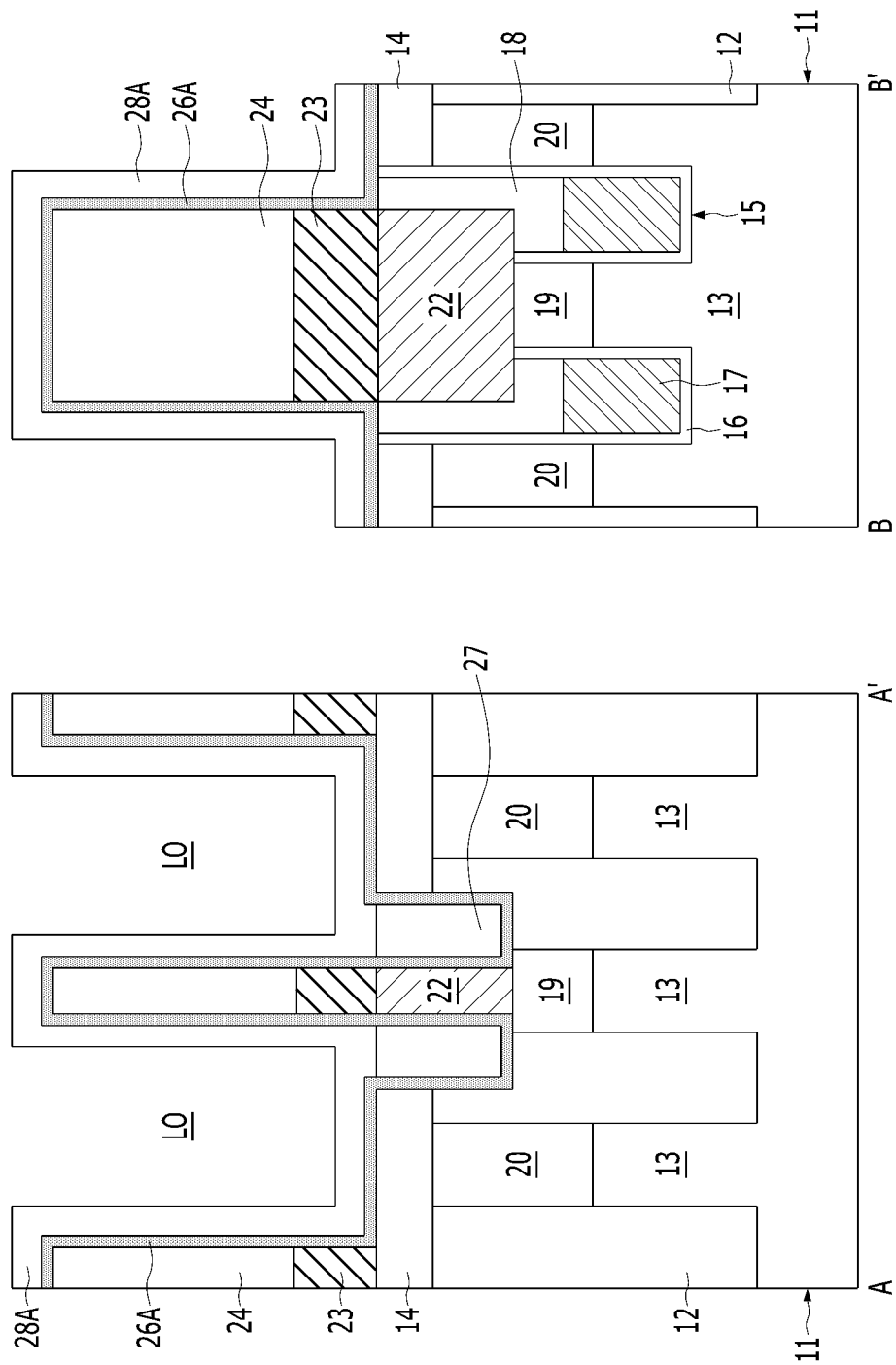
Figure 15:
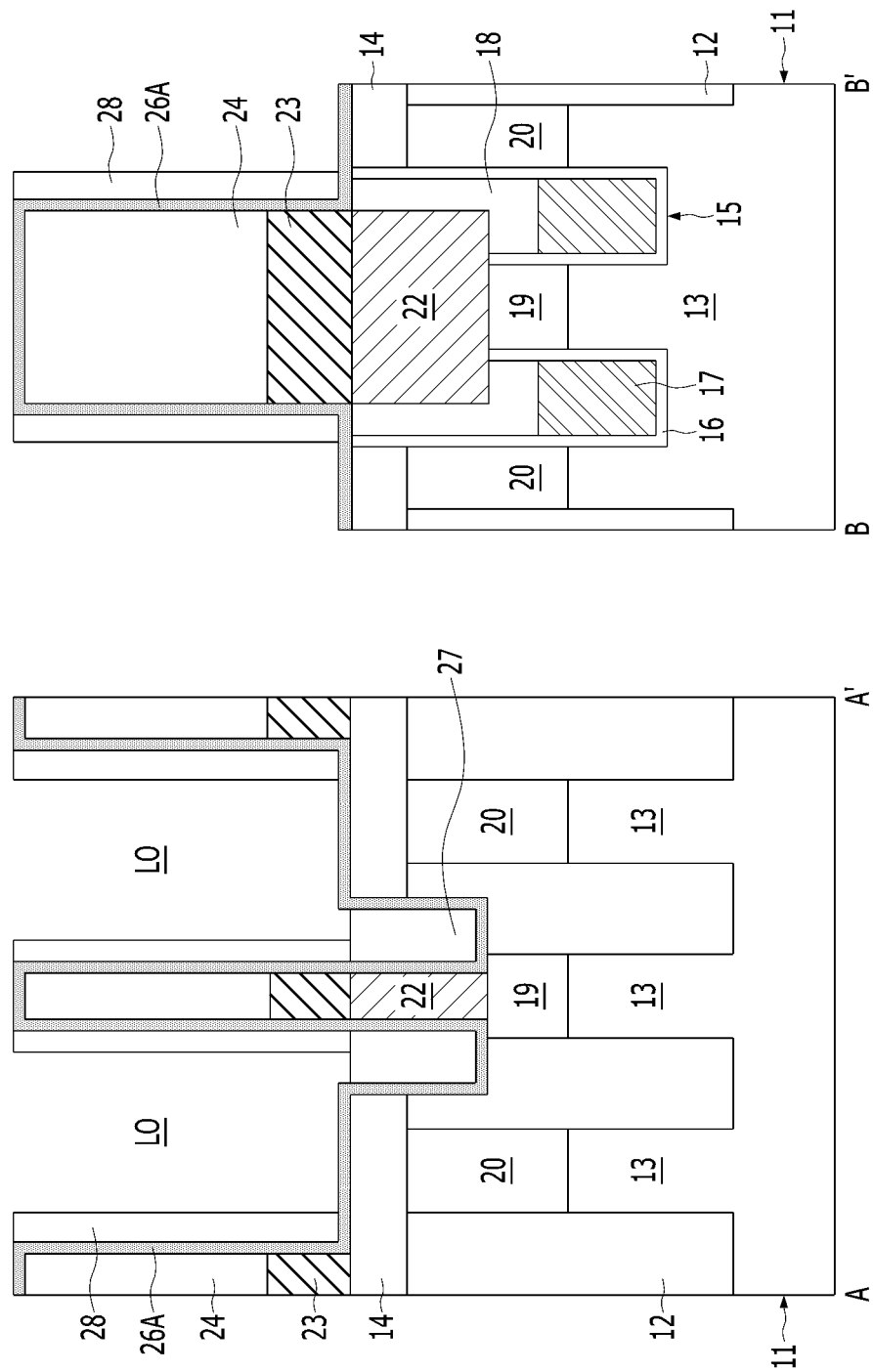

Referring to FIGS. 14 and 15, a second spacer 28 may be formed over the gap-fill spacer 27. The second spacer 28 may have a line shape extending long along both sidewalls of the bit line structure. The second spacer 28 may directly contact the upper surface of the gap-fill spacer 27. The second spacer 28 may directly contact the first spacer 26A. The second spacer 28 may have an etch selectivity with respect to the first spacer 26A. The second spacer 28 may include silicon oxide.

To form the second spacer 28, the second spacer layer 28A may be deposited over the gap-fill spacer 27 and the bit line structure, and then an etch-back process may be performed. The second spacer layer 28A may include silicon oxide. The bottom surface of the second spacer 28 may be positioned at a lower level than the bottom surface of the bit line 23. The upper surface of the second spacer 28 may be positioned at a higher level than the upper surface of the bit line hard mask 24.

Figure 16:
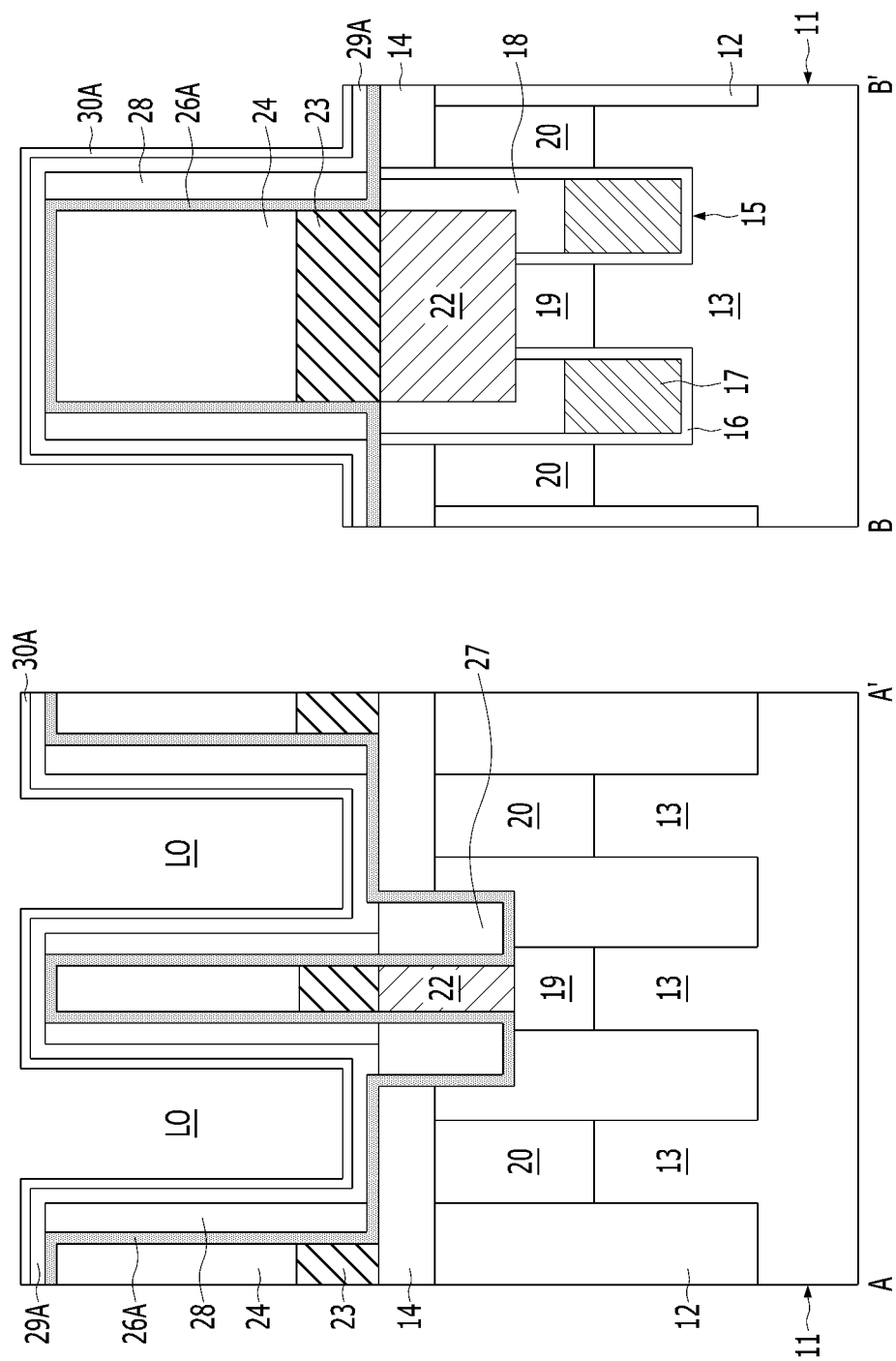

Referring to FIG. 16, first and second nitride spacer layers 29A and 30A may be formed over the second spacer 28. The first and second nitride spacer layers 29A and 30A may include silicon nitride. The first nitride spacer layer 29A may include silicon nitride ($Si_3N_4$) having a stoichiometric composition. The second nitride spacer layer 30A may include the first nitride spacer layer 29A, that is, silicon nitride having a higher content of silicon than silicon nitride ($Si_3N_4$) having a stoichiometric composition. The second nitride spacer layer 30A may include a material having a lower wet etching rate than silicon nitride having a stoichiometric composition, that is, having more improved resistance to an etchant than silicon nitride having a stoichiometric composition, while maintaining the basic physical properties of silicon nitride having a stoichiometric composition. According to an embodiment of the present invention, the second nitride spacer layer 30A may include silicon nitride having a silicon content of approximately at % to 55 at % in the film.

The second nitride spacer layer 30A may have a thickness thinner than that of the first nitride spacer layer 29A. For example, when the total thickness of the first and second nitride spacer layers 29A and 30A is approximately 40 Å to 70 Å, the first nitride spacer layer 29A may be formed to have a thickness of approximately 35 Å to 55 Å, and the second nitride spacer layer 30A may be formed to have a thickness of approximately 5 Å to 15 Å.

The first and second nitride spacer layers 29A and 30A may be formed by an Atomic Layer Deposition method (ALD). The first and second nitride spacer layers 29A and 30A may be formed by an atomic layer deposition method using $NH_3$ and dichlorosilane (DCS) as source gases. The second nitride spacer layer 30A may be formed at a higher temperature than the first nitride spacer layer 29A. According to the embodiment of the present invention, the first nitride spacer layer 29A may be deposited at a temperature of approximately 650° C., and the second nitride spacer layer 30A may be deposited at a temperature of approximately 670° C. to 710° C.

The second nitride spacer layer 30A may be formed under the condition that the amount of DCS is increased more than that of the first nitride spacer layer 29A. According to an embodiment of the present invention, the amount of DCS applied when the second nitride spacer layer 30A is deposited may be approximately 2 to 4 times as much as the amount of DCS applied when the first nitride spacer layer 29A is deposited. The deposition temperature and the amount of DCS of the first and second nitride spacer layers 29A and 30A may not be limited thereto, and they may be changed as needed in such a manner that the resistance of the second nitride spacer layer 30A to the etchant may be increased.

According to another embodiment of the present invention, the first and second nitride spacer layers 29A and 30A may not be formed as a double layer in which the contents of silicon are different, but may be formed as a single layer in which the content of silicon gradually increases, as shown in FIG. 2A. In a single-layered nitride spacer layer in which the content of silicon gradually increases, the temperature and the amount of the source may be controlled as the cycle progresses during an Atomic Layer Deposition (ALD) process. The single-layered nitride spacer layer may be controlled to have the largest amount of silicon at the farthest from the interface with the bit line structure, that is, at the outermost part of the spacer layer.

Figure 17:
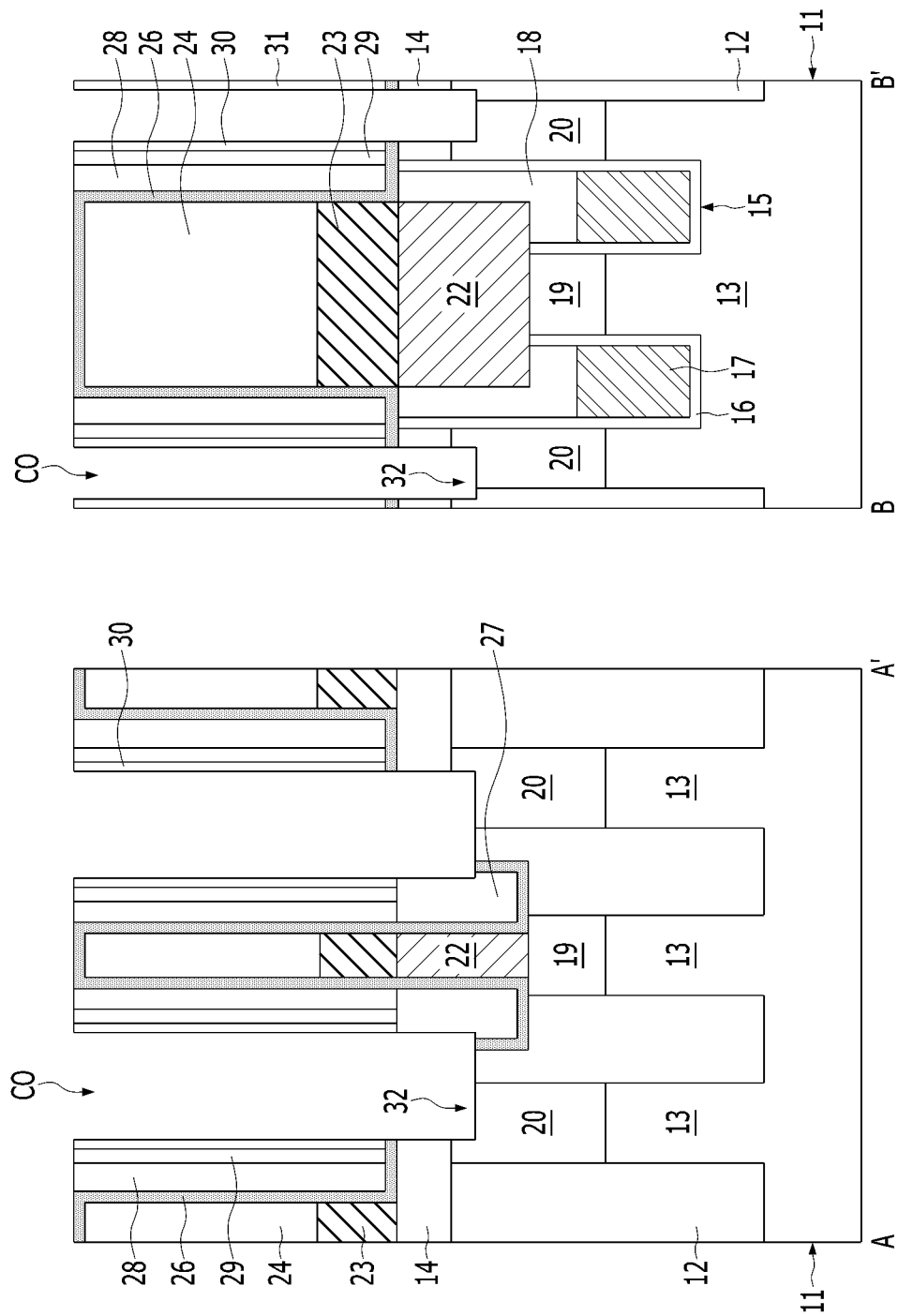

Referring to FIG. 17, a plurality of plug separation layers 31 may be formed over the second nitride spacer layer 30A. The plug separation layers 31 may separate each line-type opening LO between bit line structures into a plurality of contact openings CO. As shown in FIG. 4, the plug separation layers 31 may vertically overlap with the buried word line 17 over the buried word line 17 in the direction of the line A-A'. The plug separation layers 31 may include silicon nitride or a low-k material. According to another embodiment of the present invention, while the plug separation layers 31 are formed, a portion of the bit line hard mask 24 may be consumed.

In order to form the plug separation layers 31, a sacrificial material (not shown) such as an oxide filling between the bit line structures may be formed over the second nitride spacer layer 30A. Also, a line-shaped mask pattern (not shown) extending in a direction perpendicular to the bit line structure may be formed over the sacrificial material and the bit line structure. Also, the sacrificial material may be etched using the mask pattern and the bit line structure, and a plug separation material may gap-fill the region from which the sacrificial material is etched. Subsequently, a plurality of contact openings CO may be formed between the plug separation layers 31 by removing the residual sacrificial material.

The process of removing the residual sacrificial material may be performed by a wet etching process using an etchant. According to the embodiment of the present invention, by applying the second nitride spacer layer 30A having resistance to an etchant on the outermost portion which is in contact with the sacrificial material, damage to the spacer may be minimized when the residual sacrificial material is removed. Accordingly, the thickness of the spacer material remaining on the sidewall of the bit line structure may be stably maintained, and reliability of the device may be secured.

Referring to FIG. 4, from the perspective of a top view, the contact openings CO and the plug separation layers 31 may be alternately formed between the neighboring bit lines 23 in the direction that the bit lines 23 extend. The neighboring contact openings CO may be arranged in an isolated shape by the bit line structure and the plug separation layers 31. From the perspective of a top view, each of the contact openings CO may have a rectangular hole shape.

The lower materials may be etched so as to be self-aligned to the contact openings CO. Accordingly, a plurality of recess regions 32 exposing a portion of the active region 13 may be formed between the bit line structures. Anisotropic etching or a combination of anisotropic etching and isotropic etching may be used to form the recess regions 32. For example, among the structures exposed through the contact openings CO between the bit line structures, the first and second nitride spacer layers 29A and 30A, the second spacer layer 28A, and the first spacer layer 26A may be sequentially anisotropically etched, and then a portion of the exposed active region 13 may be isotropically etched. According to another embodiment of the present invention, the hard mask layer 14 may also be etched isotropically. Portions of the active region 13 and the gap-fill spacer 27 may be exposed by the recess regions 32.

In particular, in this embodiment of the present invention, as the second nitride spacer layer 30A having resistance to an etchant is applied to the outermost part which is in contact with the sacrificial material, the thickness of the spacer material remaining on the sidewall of the bit line structure may be stably maintained during an isotropic etching process using an etchant or a cleaning process after the etching process. Therefore, it is possible to secure the reliability of the device.

The recess regions 32 may extend into the substrate 11. While the recess regions 32 are formed, the isolation layer 12, the gate capping layer 18, and the second impurity region 20 may be recessed to a predetermined depth. The bottom surface of the recess regions 32 may be positioned at a lower level than the upper surface of the bit line contact plug 22. The bottom surfaces of the recess regions 32 may be positioned at a higher level than the bottom surface of the bit line contact plug 22. The contact openings CO and the recess regions 32 may be coupled to each other. The vertical structure of the contact openings CO and the recess regions 32 may be referred to as 'a storage node contact hole'.

A dielectric structure (or a spacer structure) may be formed on the sidewall of the bit line structure by the etching process for forming the recess regions 32. The dielectric structure may include materials having different dielectric constants and different silicon contents.

The dielectric structure may include a first spacer 26, a second spacer 28, a first nitride spacer 29, and a second nitride spacer 30. The first spacer 26 may directly contact the sidewalls of the bit line contact plug 22 and the bit line 23. The second spacer 28 may cover the first spacer 26. The first nitride spacer 29 may cover the second spacer 28, and the second nitride spacer 30 may cover the first nitride spacer 29. Accordingly, the dielectric structure may maintain a stable thickness due to the second nitride spacer 30 that covers the dielectric structure by being positioned at the outermost part during a wet etching process using an etchant or a cleaning process, and the reliability of the device may be secured.

According to another embodiment of the present invention, the dielectric structure may include a single-layer nitride spacer that replaces the first nitride spacer 29 and the second nitride spacer 30 and having the content of silicon gradually increasing, which is illustrated in FIG. 2A. According to yet another embodiment of the present invention, as illustrated in FIG. 2B, the dielectric structure may include an air gap that replaces the second spacer 28 and include a triple structure of first to third nitride spacers that replace the first and second nitride spacers 29 and 30. Herein, the first and third nitride spacers may include a nitride spacer having a higher content of silicon than silicon nitride having a stoichiometric composition. Therefore, the dielectric structure may maintain the thickness at a stable level not only in a wet etching process and/or a cleaning process for replacing the sacrificial material with the plug separation layer 31 but also in a wet etching process for replacing the second spacer 28 with an air gap. According to yet another embodiment of the present invention, as illustrated in FIG. 2C, the dielectric structure may include an air gap that replaces the second spacer 28, and include a single-layer silicon nitride that replaces the first and second nitride spacers 29 and 30 and includes the content of silicon being the smallest in the central portion and the content of silicon gradually increasing as it goes farther from the central portion.

The first spacer 26 may be positioned between the bit line contact plug 22 and the gap-fill spacer 27, and the first spacer 26 may extend to cover the bit line 23 and the bit line hard mask 24. The second spacer 28 may be positioned between the first nitride spacer 29 and the first spacer 26, and the bottom surface of the second spacer 28 may contact the upper surface of the gap-fill spacer 27. The bottom surface of the first nitride spacer 29 may contact the upper surface of the gap-fill spacer 27.

The first spacer 26, the second spacer 28, the first nitride spacer 29, and the second nitride spacer 30 may be sequentially stacked on the sidewall of the bit line 23. The first spacer 26 and the gap-fill spacer 27 may be stacked on the sidewall of the bit line contact plug 22. The sidewalls and bottom surface of the gap-fill spacer 27 may be covered by the first spacer 26.

Figure 18:
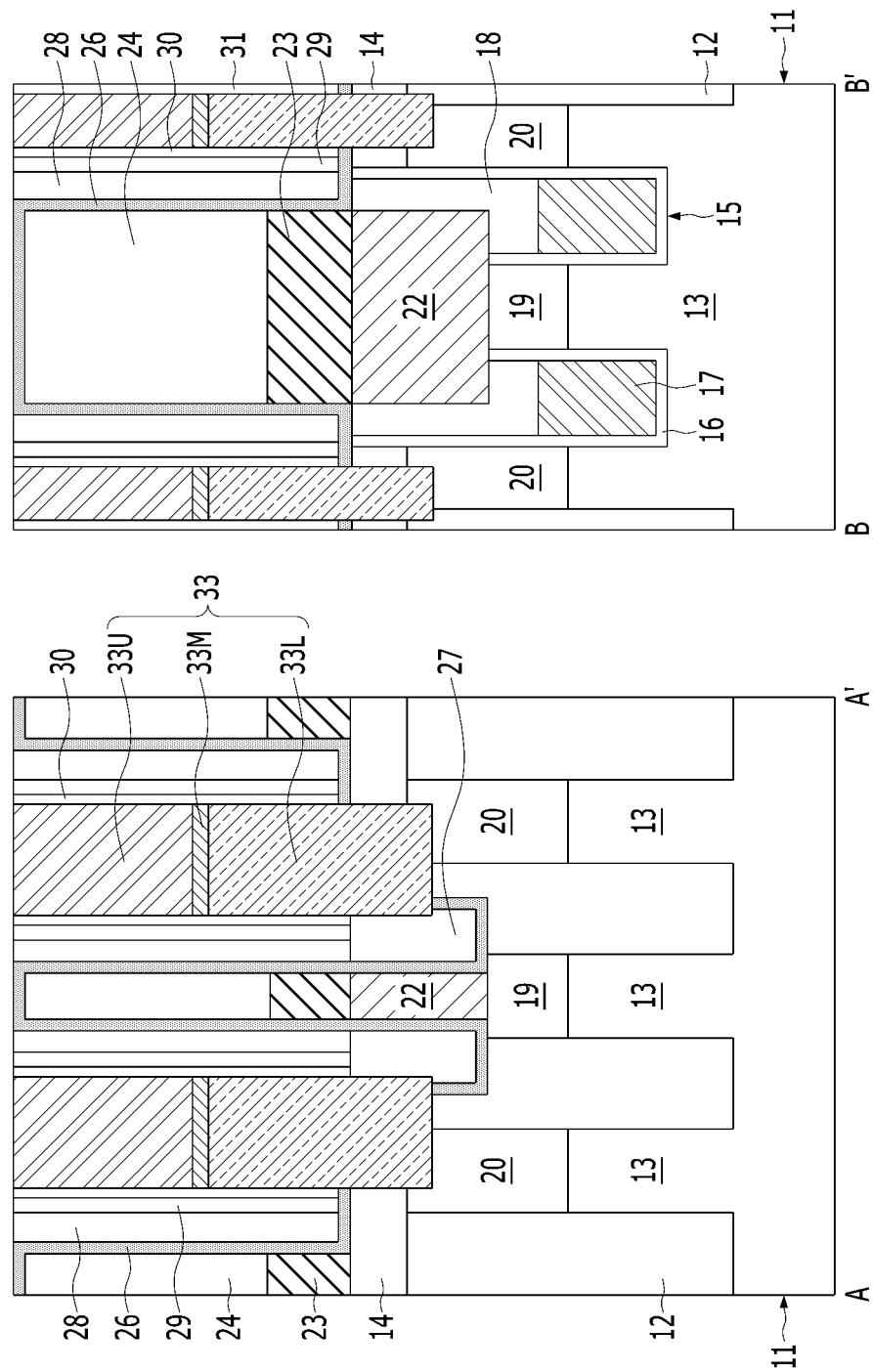

Referring to FIG. 18, a storage node contact plug 33 may be formed. The storage node contact plug 33 may fill the contact openings CO and the recess regions 32. The storage node contact plug 33 may contact the second impurity region 20. The storage node contact plug 33 may be adjacent to the bit line structure. From the perspective of a top view, a plurality of storage node contact plugs 33 may be positioned between a plurality of bit line structures. In a direction parallel to the bit line 23, a plurality of storage node contact plugs 33 and a plurality of plug separation layers 31 may be alternately positioned between the neighboring bit lines 23.

In the storage node contact plug 33, a lower plug 33L, an ohmic contact layer 33M, and an upper plug 33U may be sequentially stacked.

The lower plug 33L may include a silicon-containing material. The lower plug 33L may include polysilicon. Polysilicon may be doped with an impurity. The lower plug 33L may be coupled to the second impurity region 20. The upper surface of the lower plug 33L may be higher than the upper surface of the bit line 23. After polysilicon is deposited to fill the contact opening CO and the recess region 32 to form the lower plug 33L, a planarization process and an etch-back process may be sequentially performed.

An ohmic contact layer 33M may be formed over the lower plug 33L. The ohmic contact layer 33M may include a metal silicide. The ohmic contact layer 33M may be formed by depositing a silicideable metal layer and performing an annealing process. Accordingly, silicidation may occur at the interface between the silicide metal layer and the lower plug 33L, thereby forming a metal silicide layer. The ohmic contact layer 33M may include cobalt silicide. According to the embodiment of the present invention, the ohmic contact layer 33M may include cobalt silicide of a 'CoSi$_2$ phase'.

When cobalt silicide of the CoSi$_2$ phase is formed as the ohmic contact layer 33M, contact resistance may be improved and a low-resistance cobalt silicide may be formed.

The upper plug 33U may be formed over the ohmic contact layer 33M. The upper plug 33U may be formed by gap-filling a metal material (not shown) and performing a planarization process. The upper plug 33U may include a metal-containing layer. The upper plug 33U may include a material containing tungsten. The upper plug 33U may include a tungsten layer or a tungsten compound. According to another embodiment of the present invention, the upper end of the upper plug 33U may extend to overlap with the upper surface of the bit line hard mask 24.

Since the lower plug 33L contains polysilicon and the ohmic contact layer 33M and the upper plug 33U contain a metal material, the storage node contact plug 33 may be referred to as a hybrid plug or a semi-metal plug.

Subsequently, a memory element (see '230' in FIG. 5A) may be formed over the upper plug 33U. According to another embodiment of the present invention, a landing pad may be further formed between the upper plug 33U and the memory element.

According to an embodiment of the present invention, the reliability of the semiconductor device may be improved by minimizing the damage of the spacer and maintaining the thickness of a stable dielectric structure at a stable level.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a bit line structure formed over the substrate;
   a storage node contact plug spaced apart from the bit line structure; and
   a nitride spacer positioned between the bit line structure and the storage node contact plug,
   wherein the nitride spacer has the lowest silicon content in a central portion, and has a higher silicon content in a portion adjacent to the storage node contact plug than in the central portion.

2. The semiconductor device of claim 1, wherein the nitride spacer includes a stacked structure of first to third nitride spacers, and the first nitride spacer is in contact with the bit line structure.

3. The semiconductor device of claim 2, wherein the first and third nitride spacers have a higher silicon content than the second nitride spacer.

4. The semiconductor device of claim 2, wherein the first and third nitride spacers have a silicon content of 45 at % to 55 at %.

5. The semiconductor device of claim 1, wherein the nitride spacer is a single layer that has the lowest silicon content in the central portion and has the silicon content gradually increasing going toward the bit line structure and the storage node contact plug.

6. The semiconductor device of claim 5, wherein the nitride spacer has a silicon content of 45 at % to 55 at % in a portion closest to the bit line structure and the storage node contact plug.

7. The semiconductor device of claim 1, further comprising:
   a first and second spacers between the bit line structure and the nitride spacer.

8. The semiconductor device of claim 7, wherein the first and second spacers include different materials.

9. The semiconductor device of claim 7, wherein the first and second spacers includes silicon nitride, silicon oxide, or a combination thereof.

10. The semiconductor device of claim 7, wherein the first spacer includes silicon nitride, and the second spacer in an air gap spacer.

* * * * *